US 012095479B2

(12) United States Patent
Luo

(10) Patent No.: US 12,095,479 B2
(45) Date of Patent: *Sep. 17, 2024

(54) RECURRENT NEURAL NETWORKS AND SYSTEMS FOR DECODING ENCODED DATA

(71) Applicant: MICRON TECHNOLOGY, INC., Boise, ID (US)

(72) Inventor: Fa-Long Luo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/821,391

(22) Filed: Aug. 22, 2022

(65) Prior Publication Data

US 2022/0399904 A1 Dec. 15, 2022

Related U.S. Application Data

(63) Continuation of application No. 16/683,217, filed on Nov. 13, 2019, now Pat. No. 11,424,764.

(51) Int. Cl.
*H03M 13/15* (2006.01)
*G06F 7/544* (2006.01)
(Continued)

(52) U.S. Cl.
CPC ...... *H03M 13/1515* (2013.01); *G06F 7/5443* (2013.01); *G06N 3/045* (2023.01); *H03M 13/1102* (2013.01)

(58) Field of Classification Search
None
See application file for complete search history.

(56) References Cited

U.S. PATENT DOCUMENTS 7,321,882 B2 1/2008 Jaeger
9,988,090 B2 6/2018 Nishikawa
(Continued)

FOREIGN PATENT DOCUMENTS

CN 108353046 A 7/2018
KR 20170128080 A 11/2017
(Continued)

OTHER PUBLICATIONS

I. Wodiany and A. Pop, "Low-Precision Neural Network Decoding of Polar Codes," 2019 IEEE 20th International Workshop on Signal Processing Advances in Wireless Communications (SPAWC), Cannes, France, 2019, pp. 1-5, doi: 10.1109/SPAWC.2019.8815542. (Year: 2019).*

(Continued)

*Primary Examiner* — Daniel F. McMahon
(74) *Attorney, Agent, or Firm* — Dorsey & Whitney LLP

(57) ABSTRACT

Examples described herein utilize multi-layer neural networks, such as multi-layer recurrent neural networks to decode encoded data (e.g., data encoded using one or more encoding techniques). The neural networks and/or recurrent neural networks have nonlinear mapping and distributed processing capabilities which are advantageous in many systems employing the neural network decoders and/or recurrent neural networks. In this manner, neural networks or recurrent neural networks described herein are used to implement error correction coding (ECC) decoders.

19 Claims, 9 Drawing Sheets

(51) Int. Cl.
   *G06N 3/045* (2023.01)
   *H03M 13/11* (2006.01)

(56) References Cited

U.S. PATENT DOCUMENTS

| | | | |
|---|---|---|---|
| 10,176,802 | B1 | 1/2019 | Ladhak et al. |
| 10,400,928 | B2 | 9/2019 | Baldwin et al. |
| 10,491,243 | B2 | 11/2019 | Kumar et al. |
| 10,552,738 | B2 | 2/2020 | Holt et al. |
| 10,698,657 | B2 | 6/2020 | Kang et al. |
| 10,749,594 | B1 | 8/2020 | O'shea et al. |
| 10,812,449 | B1 | 10/2020 | Cholleton |
| 10,924,152 | B1 | 2/2021 | Luo |
| 11,088,712 | B2 | 8/2021 | Zamir et al. |
| 11,196,992 | B2 | 12/2021 | Huang et al. |
| 11,416,735 | B2 | 8/2022 | Luo et al. |
| 11,424,764 | B2 | 8/2022 | Luo |
| 11,563,449 | B2 | 1/2023 | Luo et al. |
| 11,599,773 | B2 | 3/2023 | Luo et al. |
| 11,755,408 | B2 | 9/2023 | Luo et al. |
| 2004/0015459 | A1 | 1/2004 | Jaeger |
| 2005/0228845 | A1* | 10/2005 | Pius Ng ............... G06F 7/5306 708/627 |
| 2006/0013289 | A1 | 1/2006 | Hwang |
| 2006/0200258 | A1 | 9/2006 | Hoffberg et al. |
| 2009/0106626 | A1 | 4/2009 | Hou et al. |
| 2009/0292537 | A1 | 11/2009 | Ehara et al. |
| 2011/0029756 | A1 | 2/2011 | Biscondi et al. |
| 2017/0177993 | A1 | 6/2017 | Draelos et al. |
| 2017/0310508 | A1 | 10/2017 | Moorti et al. |
| 2017/0370508 | A1 | 12/2017 | Baldwin et al. |
| 2018/0022388 | A1 | 1/2018 | Nishikawa |
| 2018/0046897 | A1 | 2/2018 | Kang et al. |
| 2018/0174050 | A1 | 6/2018 | Holt et al. |
| 2018/0249158 | A1 | 8/2018 | Huang et al. |
| 2018/0307494 | A1 | 10/2018 | Ould-Ahmed-Vall et al. |
| 2018/0322388 | A1 | 11/2018 | O'Shea |
| 2018/0336469 | A1 | 11/2018 | O'Connor et al. |
| 2018/0343017 | A1 | 11/2018 | Kumar et al. |
| 2018/0357530 | A1 | 12/2018 | Beery et al. |
| 2019/0196952 | A1 | 6/2019 | Manchiraju et al. |
| 2019/0197549 | A1 | 6/2019 | Sharma |
| 2020/0012953 | A1 | 1/2020 | Sun et al. |
| 2020/0014408 | A1 | 1/2020 | Kim |
| 2020/0065653 | A1 | 2/2020 | Meier et al. |
| 2020/0160838 | A1 | 5/2020 | Lee |
| 2020/0210816 | A1 | 7/2020 | Luo et al. |
| 2020/0234103 | A1 | 7/2020 | Luo et al. |
| 2020/0296741 | A1 | 9/2020 | Ayala Romero et al. |
| 2020/0356620 | A1* | 11/2020 | Yen ..................... G06F 7/5443 |
| 2020/0402591 | A1 | 12/2020 | Xiong et al. |
| 2021/0004208 | A1* | 1/2021 | Lai ..................... G06F 7/5443 |
| 2021/0143840 | A1 | 5/2021 | Luo |
| 2021/0273707 | A1 | 9/2021 | Yoo et al. |
| 2021/0287074 | A1 | 9/2021 | Coenen |
| 2021/0304009 | A1 | 9/2021 | Bazarsky et al. |
| 2021/0319286 | A1 | 10/2021 | Gunduz |
| 2021/0336779 | A1 | 10/2021 | Jho et al. |
| 2021/0351863 | A1 | 11/2021 | Gunduz |
| 2022/0019900 | A1 | 1/2022 | Wong et al. |
| 2022/0368349 | A1 | 11/2022 | Luo et al. |
| 2022/0368356 | A1 | 11/2022 | Luo et al. |
| 2023/0115877 | A1 | 4/2023 | Luo et al. |
| 2023/0208449 | A1 | 6/2023 | Luo et al. |

FOREIGN PATENT DOCUMENTS

| | | |
|---|---|---|
| KR | 20180054554 A | 5/2018 |
| KR | 20180084988 A | 7/2018 |
| KR | 20200062322 A | 6/2020 |
| KR | 20200124504 A | 11/2020 |
| WO | 2020131868 A1 | 6/2020 |
| WO | 2020139976 A1 | 7/2020 |
| WO | 2021096641 A1 | 5/2021 |
| WO | 2022232065 A1 | 11/2022 |
| WO | 2022232066 A1 | 11/2022 |

OTHER PUBLICATIONS

PCT Application No. PCT/US19/68616, titled "Neural Networks and Systems for Decoding Encoded Data", filed Dec. 26, 2019; pp. all.

PCT Application No. PCT/US2022/045432 filed on Sep. 30, 2022 titled, "Systems for Estimating Bit Error Rate (BER) of Encoded Data Using Neural Networks"; pp. all.

PCT Application No. PCT/US22/26217 titled "Systems for Error Reduction of Encoded Data Using Neural Networks" filed Apr. 25, 2022; pp. all.

PCT Application No. PCT/US22/26219 titled "Decoders and Systems for Decoding Encoded Data Using Neural Networks" filed Apr. 25, 2022; pp. all.

PCT Application PCT/US20/56151 titled "Recurrent Neural Networks and Systems for Decoding Encoded Data" filed Oct. 16, 2020; pp. all.

Navneet Agrawal "Machine Intelligence in Decoding of Forward Error Correction Codes"; Degree Project in Information and Communication Technology; KTH Royal Institute of Technology, School of Electrical Engineering; Sweeden Oct. 2017; pp. all.

U.S. Appl. No. 18/158,332, filed Jan. 23, 2023, titled, "Systems for Error Reduction of Encoded Data Using Neural Networks,"; pp. all pages of application as filed.

U.S. Appl. No. 16/839,447, titled "Neural Networks and Systems for Decoding Encoded Data", dated Apr. 3, 2020, pp. all pages of application as filed.

U.S. Appl. No. 16/683,217, titled "Recurrent Neural Networks And Systems For Decoding Encoded Data", filed Nov. 13, 2019, pp. all pages of application as filed.

Huo et al. "A Tutorial and Review on Inter-Layer FEC Coded Layered Video Streaming" in IEEE Communications Survey & Tutorials, vol. 17, No. 2, 2nd Quarter 2015; pp. 1166-1207.

ISR/WO dated Jan. 26, 2021 for PCT Application No. PCT/US2020/056151, pp. all.

U.S. Appl. No. 17/496,703 titled "Systems for Estimating Bit Error Rate (BER) of Encoded Data Using Neural Networks" filed Oct. 7, 2021, pp. all pages of application as filed.

U.S. Appl. No. 17/302,226, titled "Decoders and Systems for Decoding Encoded Data Using Neural Networks", filed Apr. 27, 2021, pp. all pages of application as filed.

U.S. Appl. No. 17/302,228, titled "Systems for Error Reduction of Encoded Data Using Neural Networks", filed Apr. 27, 2021, pp. all pages of application as filed.

U.S. Appl. No. 16/233,576 titled "Neural Networks and Systems for Decoding Encoded Data" filed Dec. 27, 2018, pp. all pages of application as filed.

Cao Congzhe et al., "Deep Learning-Based Decoding of Constrained Sequence Codes", Retrieved from URL: https://arxiv.org/pdf/1906.06172, Jun. 2019, 13 pages.

Huang, Kunping et al., "Functional Error Correction for Robust Neural Networks", Retrieved from URL: https://arxiv.org/pdf/2001.03814, Jan. 2020, 24 pages.

Kim, Minhoe et al., "Building Encoder and Decoder With Deep Neural Networks: On the Way to Reality", Retrieved from URL: https://arxiv.org/pdf/1808.02401, Aug. 2018, 14 pages.

Lipton, Zachary C. et al., "A Critical Review of Recurrent Neural Networks for Sequence Learning", Retrieved from https://arxiv.org/abs/1506.00019v4, Oct. 17, 2015, pp. all.

Sun, Yang et al., "VLSI Architecture for Layered Decoding of QC-LDPC Codes With High Circulant Weight" IEEE Transactions on Very Large Scale Integration (VLSI) Systems, vol. 21, No. 10, pp. 1960-1964, Oct. 2013.

U.S. Appl. No. 18/179,317, filed Mar. 6, 2023 and titled, "Neural Networks and Systems for Decoding Encoded Data,"; pp. all pages of application as filed.

(56) References Cited

OTHER PUBLICATIONS

Chang, Andre, et al., "Hardware Accelerators for Recurrent Neural Networks On FPGA", IEEE International Symposium on Circuits and Systems (ISCAS), 4 pgs, May 2017.

Kim, Minhoe, et al., "Toward the Realization of Encoder and Decoder Using Deep Neural Networks", IEEE Communications Magazine, vol. 57, No. 5, 7 pages, May 2019.

Nachmani, Eliya, et al., "RNN Decoding of Linear Block Codes", arxiv.org, Cornell University Library, 7 pgs, Feb. 2017.

Payani, Ali, et al., "Decoding LDPC Codes on Binary Erasure Channels Using Deep Recurrent Neural-Logic Layers", IEEE 10th International Symposium on Turbo Codes & Iterative Information Processing, 5 pgs, Dec. 2018.

Sandoval Ruiz, Cecilia, "FPGA Prototyping of Neuro-Adaptive Decoder", Advances in Computational Intelligence, Man-Machine Systems and Cybernetics, 6 pgs, Dec. 2010.

Soltani, Rohollah, et al., "Higher Order Recurrent Neural Networks", Retrieved May 31, 2023 from: https://arxiv.org/pdf/1605.00064.pdf, 9 pgs.

Teng, Chieh-Fang, et al., "Low-Complexity Recurrent Neural Network-Based Polar Decorder With Weight Quantization Mechanism", arxiv.org, Cornell University Library, 5 pgs, Oct. 2018.

Agrawal, Navneet, "Machine Intelligence in Decoding of Forward Error Correction Codes", KTH Royal Institute of Technology, School of Electrical Engineering, Degree Project in Information and Communication Technology, Second Cycle; Oct. 2, 2017; pp. all.

\* cited by examiner

RECURRENT NEURAL NETWORKS AND SYSTEMS FOR DECODING ENCODED DATA

CROSS REFERENCE TO RELATED APPLICATION(S)

This application is a continuation of U.S. patent application Ser. No. 16/683,217 filed Nov. 13, 2019 and issued as U.S. Pat. No. 11,424,764 on Aug. 23, 2022. The aforementioned application, and issued patent, is incorporated herein by reference, in its entirety, for any purpose.

TECHNICAL FIELD

Examples described herein relate to neural networks for use in decoding encoded data. Examples of neural networks are described which may be used with error-correcting coding (ECC) memory, where a neural network may be used to decode encoded data.

BACKGROUND

Error correction coding (ECC) may be used in a variety of applications, such as memory devices or wireless baseband circuitry. Generally, error correction coding techniques may encode original data with additional bits to describe the original bits which are intended to be stored, retrieved, and/or transmitted. The additional bits may be stored together with the original bits. Accordingly, there may be L bits of original data to be stored and/or transmitted. An encoder may provide N-L additional bits, such that the encoded data may be N bits worth of data. The original bits may be stored as the original bits, or may be changed by the encoder to form the encoded N bits of stored data. A decoder may decode the N bits to retrieve and/or estimate the original L bits, which may be corrected in some examples in accordance with the ECC technique.

Bit flips (e.g., a change in charge at a memory cell) are an occurrence in non-volatile memory devices, where ECC may be applied. Thus, memory devices may operate with complex error correction techniques whose area and power needs are rising; resulting in higher cost silicon and longer firmware development times.

DETAILED DESCRIPTION

Figure 1A:
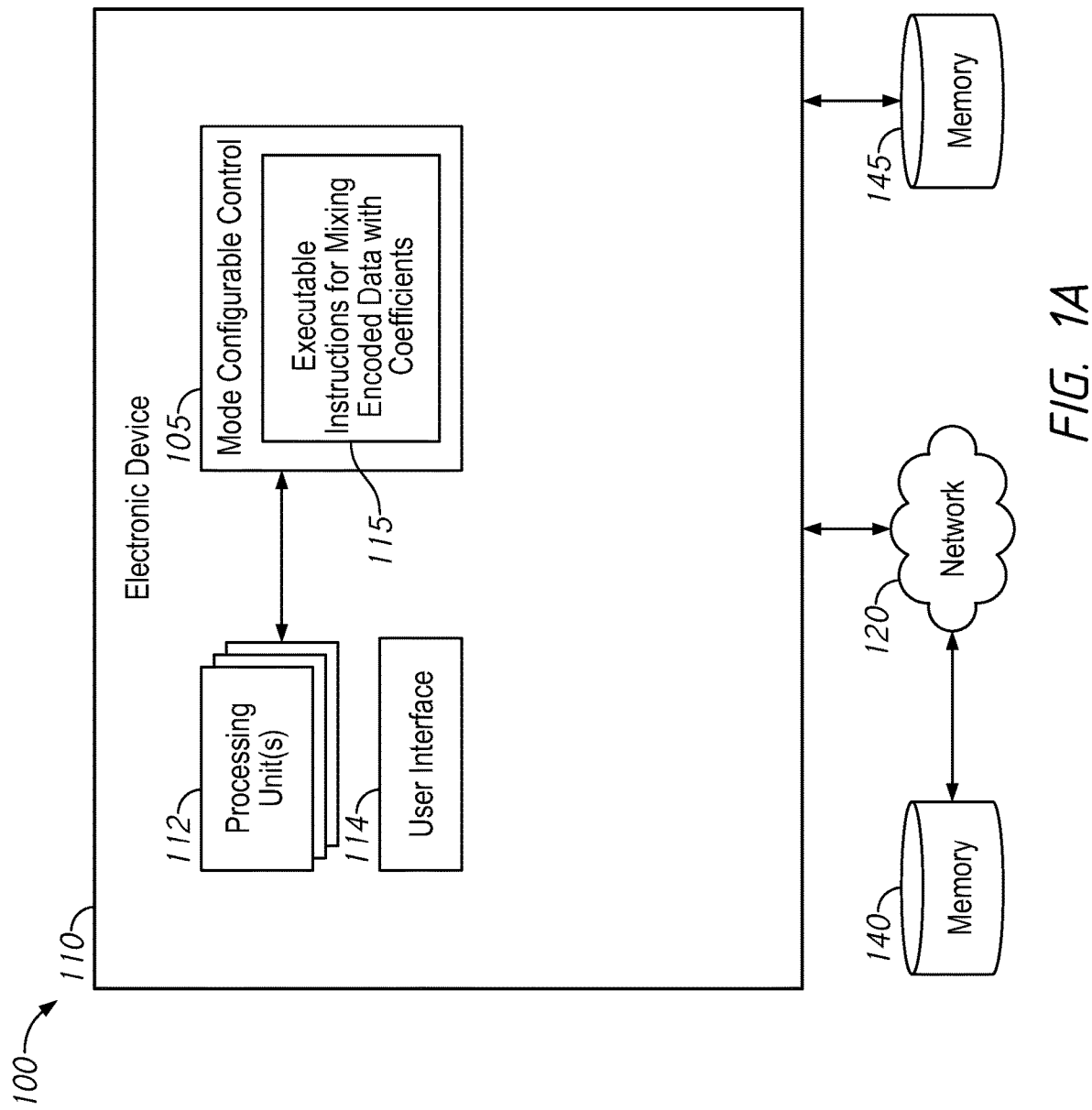
FIG. 1A is a schematic illustration of a computing system arranged in accordance with examples described herein.

Multi-layer neural networks and/or multi-layer recurrent neural networks may be used to decode encoded data (e.g., data encoded using one or more encoding techniques). Such neural networks may have nonlinear mapping and distributed processing capabilities which may be advantageous in many systems employing the neural network decoders. In this manner, neural networks described herein may be used to implement error correction coding (ECC) decoders.

An encoder may have L bits of input data (a1, a2, ... aL). The encoder may encode the input data in accordance with an encoding technique to provide N bits of encoded data (b1, b2, ... bN). The encoded data may be stored and/or transmitted, or some other action taken with the encoded data, which may introduce noise into the data. Accordingly, a decoder may receive a version of the N bits of encoded data (x1, x2, ... xN). The decoder may decode the received encoded data into an estimate of the L bits original data (y1, y2, ... yL).

Examples of wireless baseband circuitry may utilize error correction coding (such as low density parity check coding, LDPC). An encoder may add particularly selected N-L bits into an original data of L bits, which may allow a decoder to decode the data and reduce and/or minimize errors introduced by noise, interferences and other practical factors in the data storage and transmission.

There are a variety of particular error correction coding techniques, including low density parity check coding (LDPC), Reed-Solomon coding, Bose-Chaudhuri-Hocquenghem (BCH), and Polar coding. The use of these coding techniques, however, may come at the cost of the decrease of the frequency and/or channel and/or storage resource usage efficiency and the increase of the processing complexity. For example, the use of coding techniques may increase the amount of data which may be stored and/or transmitted. Moreover, processing resources may be necessary to implement the encoding and decoding. In some examples, the decoder may be one of the processing blocks that cost the most computational resources in wireless baseband circuitry and/or memory controllers, which may reduce the desirability of existing decoding schemes in many emerging applications such as Internet of Things (IoT) and/or tactile internet where ultra-low power consumption and ultra-low latency are highly desirable.

Examples described herein utilize multi-layer neural networks (NNs), such as multi-layer recurrent neural networks (RNNs) to decode encoded data (e.g., data encoded using one or more encoding techniques). The NNs and/or RNNs have nonlinear mapping and distributed processing capabilities which may be advantageous in many systems employing the neural network decoders. For example, in some non-volatile memory devices where bit flips may degrade memory storage capabilities, NNs and/or RNNs may provide a more robust decoder that may be trained to transform noisy encoded input data to decoded data (e.g., an estimate of the decoded data). Advantageously, such noisy encoded data, may be decoded such that the NNs or RNNs reduce and/or improve errors which may be introduced by noise present in the input data. In the example, such noise may be introduced in storing the encoded data in memory that is degraded (e.g., due to bit flips).

FIG. 1A is a schematic illustration of an electronic device 110 arranged in a system 100 in accordance with examples described herein. The electronic device 110 is coupled to a memory 140 via network 120 or memory 145, each of which may store coefficient data. Coefficient data stored in the memory 140 or memory 145 may include coefficient data which may be mixed with noisy encoded input data received by the electronic device 110 in examples described herein. The encoded input data may also be stored in the memory 140 or 145. The electronic device 110 may obtain the encoded input data (e.g., m encoded input bits) from the memory 140 or memory 145 to decode the data to be output as decoded output data.

Electronic device 110 also includes processing units 112 that may interact with mode configurable control 105, which may be encoded with instructions executable by the processing unit(s) 112. In some implementations, mode configurable control 105 may be implemented as a memory. As used herein, memory may refer to computer readable media, which may include both storage media and communication media. Example computer readable media may include volatile and nonvolatile, removable and non-removable media implemented in any method or technology for storage of information, such as computer readable instructions. The mode configurable control 105 includes the executable instructions 115 for mixing encoded input data with coefficients. For example, the mode configuration control 105 may be implemented using circuitry (e.g., logic), one or more processor(s), microcontroller(s), controller(s), or other elements. The mode configuration control 105 may select certain weights and/or other parameters (e.g., from memory 145 which may store weights) and provide those weights and/or other parameters to one or more of the multiplication/accumulation units and/or memory look-up units of FIGS. 2A-2C whose details will be presented after describing FIGS. 1A-1C. In some examples, weights and/or other parameters stored in the memory 145 may be associated with a particular encoding technique; such as Reed-Solomon coding, Bose-Chaudhuri-Hocquenghem (BCH) coding, low-density parity check (LDPC) coding, Polar coding, or combinations thereof. During operation, the mode configuration control 105 may be used to select weights and/or other parameters in memory 140 or memory 145 based on an indicated encoding technique. For example, header information or another flag associated with encoded input data (e.g., obtained from memory 140 or 145) may indicate a particular encoding technique. In the example, the mode configuration control 105 may select weights and/or other parameters from the memory 140 or memory 145 to decode encoded input data into decoded data.

The processing unit(s) 112 may be implemented using one or more processors, for example, having any number of cores. In some examples, the processing unit(s) 112 may include circuitry, including custom circuitry, and/or firmware for performing functions described herein. For example, circuitry can include multiplication unit/accumulation units for performing the described functions, as described herein. Processing unit(s) 112 can be any type including but not limited to a microprocessor or a digital signal processor (DSP), or any combination thereof. For example, processing unit(s) 112 can include levels of caching, such as a level one cache and a level two cache, a core, and registers. An example processor core can include an arithmetic logic unit (ALU), a bit manipulation unit, a multiplication unit, an accumulation unit, an adder unit, a look-up table unit, a memory look-up unit, or any combination thereof. Examples of processing unit 112 are described herein, for example with reference to FIG. 2A, 2B, or 2C.

The mode configurable control 105, for example, may be encoded with executable instructions 115 for mixing encoded input data with coefficient data, e.g., to mix noisy encoded input data with coefficient data at the processing units 112. For example, in the context of decoding noisy encoded input data from memory 140 or 145, the executable instructions 115 for mixing encoded input data with coefficient data may include instructions for obtaining the noisy encoded input data from the memory 140 or 145; and to transform that obtained noisy encoded input data at the processing unit(s) 112 into decoded data (e.g., an estimate of the decoded data). For example, the executable instructions 115 for mixing encoded input data with coefficient data may further include instructions for multiplying a portion of the noisy encoded input data with coefficient data to generate a coefficient multiplication result and accumulating the coefficient multiplication result to be further multiplied and accumulated with another portion of the noisy encoded input data and coefficient data, examples of which are described herein. For example, to generate a coefficient multiplication result, a first layer of multiplication/accumulation processing units (MAC units) may calculate the noisy encoded input data with the plurality of coefficients to generate such coefficient multiplication results, or first processing results of the first layer of MAC units. Continuing in the example, to provide the output data, additional layers of MAC units may calculate the first processing results with additional pluralities of coefficients to generate additional coefficient multiplication results, or second processing results of the additional layers of MAC units. The MLUs of a last layer of the additional layers of MAC units may provide the decoded data based on the second processing results. Accordingly, the executable instructions 115 for mixing encoded input data with coefficient data may include various sets of executable instructions for different types of hardware implementations, such as those shown in FIGS. 2A-2C, to implement such mixing of noisy encoded input data with coefficient data.

The user interface 114 may be implemented with any of a number of input devices including, but not limited to, a touchscreen, keyboard, mouse, microphone, or combinations thereof. The user interface 114 may receive input from a user, for example, regarding a processing mode selection to specify a processing mode for the processing unit(s) 112. The user interface 114 may communicate the user input to the mode configurable control 105. Example user interfaces 114 include a serial interface controller or a parallel interface controller, which may be configured to communicate with external input devices (e.g., keyboard, mouse, pen, voice input device, touch input device, etc.).

The network 120 may include a wired network or direct-wired connection, and wireless media such as acoustic, radio frequency (RF), microwave, infrared (IR) and other wireless media.

The memory(s) 140, and 145 (or mode configurable control 105, if being implemented as a memory) may be implemented using any storage medium accessible to the processing unit(s) 112. For example, RAM, ROM, solid state memory, flash memory, disk drives, system memory, optical storage, or combinations thereof, may be used to implement the mode configurable control 105 or memory(s) 140, and 145. In storing encoded data in such memories, environmental or other noise may be introduced in the storing process. For example, noise may be introduced in storing the encoded data in memory 140 or 145 that is degraded (e.g., due to bit flips). Accordingly, data obtained from the memory(s) 140 or 145 may be referred to as noisy encoded input data. In some implementations, the mode configurable control 105 may store associations between coefficients and particular encoding techniques described herein.

The electronic device 110 may be implemented using any of a variety of computing systems, including but not limited to one or more desktop, server, laptop, or other computers. The electronic device 110 generally includes one or more processing unit(s) 112. The computing system 100 may be implemented as a mobile communication device using any user communication device, including but not limited to, a desktop, laptop, cellular phone, tablet, appliance, automobile, or combinations thereof. The electronic device 110 may be programmed with a mobile application (e.g. processing unit(s) 112 and computer readable media encoded with instructions which, when executed, cause the electronic device 110 to perform described functions) for mixing noisy encoded input data with coefficient data. For example, the electronic device 110 may be programmed to receive an indication from a touchscreen of a mobile communication device that a particular encoding technique was utilized for the noisy encoded input data received in a 5G wireless transmission.

It is to be understood that the arrangement of computing systems of the system 100 may be quite flexible, and although not shown, it is to be understood that the system 100 may include many electronic devices 110, which may be connected via the network 120 can operate in conjunction with each other to perform the systems and methods described herein. The memory 145 and/or the memory 140 may in some examples be implemented using the same media, and in other examples may be implemented using different media. For example, while the memory 140 is shown in FIG. 1A as coupled to the network 120, it can be appreciated that the memory 140 may also be implemented electronic device 110 as part of the mode configurable control 105. Additionally, while a single user interface 114 is shown in FIG. 1A, it can be appreciated that the electronic device 110 may further include any number of input devices, output devices, and/or peripheral components. For example, the user interface 114 may be the interface of a mobile communication device.

Figure 1B:
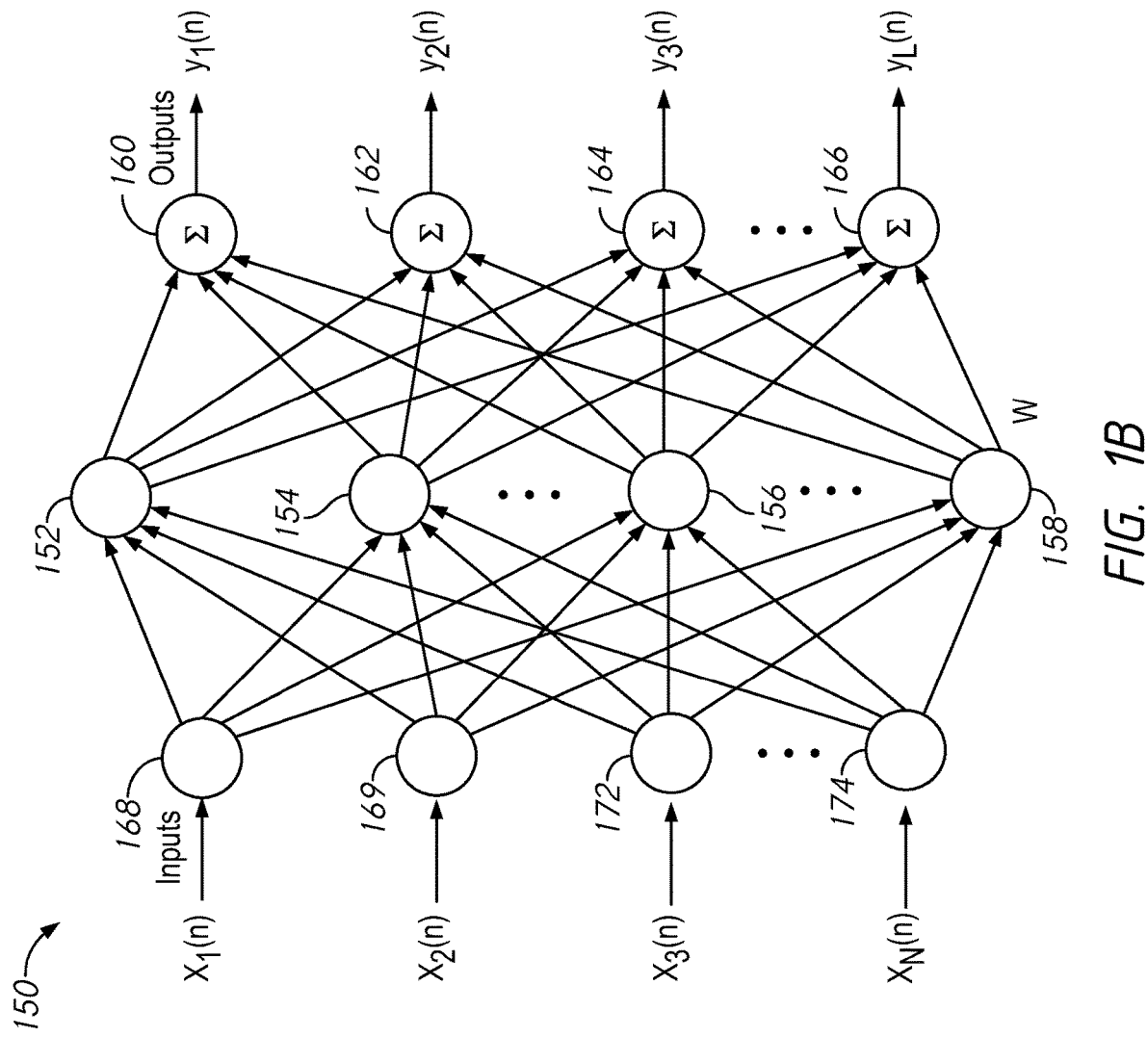
FIG. 1B is a schematic illustration of a neural network arranged in accordance with examples described herein.

FIG. 1B is a schematic illustration of a neural network arranged in accordance with examples described herein. The neural network 150 include three stages (e.g., layers). While three stages are shown in FIG. 1B, any number of stages may be used in other examples. A first stage of neural network 150 includes node 168, node 169, node 172, and node 174. A second stage of neural network 150 includes combiner 152, combiner 154, combiner 156, and combiner 158. A third stage of neural network 150 includes combiner 160, combiner 162, combiner 164, and combiner 166. Additional, fewer, and/or different components may be used in other examples.

Generally, a neural network may be used including multiple stages of nodes. The nodes may be implemented using processing units (e.g., processing units 112) which may execute one or more functions on inputs received from a previous stage and provide the output of the functions to the next stage of the neural network. The processing units may be implemented using, for example, one or more processors, controllers, and/or custom circuitry, such as an application specific integrated circuit (ASIC) and/or a field programmable gate array (FPGA). In some examples, the processing units may be implemented using any combination of one or more processing units described with respect to FIGS. 2A-2C. The processing units may be implemented as combiners and/or summers and/or any other structure for performing functions allocated to the processing unit. In some examples, certain of the elements of neural networks described herein perform weighted sums, e.g., may be implemented using one or more multiplication/accumulation units, which may be implemented using processor(s) and/or other circuitry. In an example, the neural network 150 may be implemented by the electronic device 110.

In the example, of FIG. 1B, the neural network 150 may have an input layer, which may be a first stage of the neural network including node 168, node 169, node 172, and node 174. The nodes node 168, node 169, node 172, and node 174 may implement a linear function which may provide the input signals (e.g., x1(n), x2(n), ... xm(n)) to another stage of the neural network (e.g., a 'hidden stage' or 'hidden layer'). Accordingly, in the example of FIG. 1B, m bits of noisy encoded input data may be provided to an input stage (e.g., an input layer) of a neural network during operation. In some examples, the input data may be data encoded in accordance with an encoding technique (e.g., low density parity check coding (LDPC), Reed-Solomon coding, Bose-Chaudhuri-Hocquenghem (BCH), and/or Polar coding). The m bits of input data may be output by the first stage of the neural network 150 to a next stage of the neural network 150. In some examples, the connection between the first stage and the second stage of the neural network 150 may not be weighted—e.g., processing units in the second stage may receive unaltered bits from the first stage in some examples. Each of the input bit may be provided to multiple ones of the processing units in the next stage. While an input layer is shown, in some examples, the input layer may not be present.

The neural network 150 may have a next layer, which may be referred to as a 'hidden layer' in some examples. The next layer may include combiner 152, combiner 154, combiner 156, and combiner 158, although any number of elements may be used. While the processing elements in the second stage of the neural network 150 are referred to as combiners, generally the processing elements in the second stage may perform a nonlinear activation function using the input data bits received at the processing element. Any number of nonlinear activation functions may be used. Examples of functions which may be used include Gaussian functions, such as $$f(r) = \exp\left(-\frac{r^2}{\sigma^2}\right).$$

Examples of functions which may be used include multi-quadratic functions, such as $f(r)=(r^2+\sigma^2)^{1/2}$. Examples of functions which may be used include inverse multi-quadratic functions, such as $f(r)=(r^2+\sigma^2)^{-1/2}$. Examples of functions which may be used include thin-plate-spline functions, such as $f(r)=r^2 \log(r)$. Examples of functions which may be used include piece-wise linear functions, such as $f(r)=\frac{1}{2}(|r+1|-|r-1|)$. Examples of functions which may be used include cubic approximation functions, such as $f(r)=\frac{1}{2}(|r^3+1|-|r^3-1|)$. In these example functions, a represents a real parameter (e.g., a scaling parameter) and r is the distance between the input vector and the current vector. The distance may be measured using any of a variety of metrics, including the Euclidean norm.

Each element in the 'hidden layer' may receive as inputs selected bits (e.g., some or all) of the input data. For example, each element in the 'hidden layer' may receive as inputs from the output of multiple selected elements (e.g., some or all elements) in the input layer. For example, each element in the 'hidden layer' may receive as inputs from the output of multiple selected units (e.g., some or all units) in the input layer. For example, the combiner 152 may receive as inputs the output of node 168, node 169, node 172, and node 174. While a single 'hidden layer' is shown by way of example in FIG. 1B, any number of 'hidden layers' may be present and may be connected in series. While four elements are shown in the 'hidden layer', any number may be used, and they may be the same or different in number than the number of nodes in the input layer and/or the number of nodes in any other hidden layer. The nodes in the hidden layer may evaluate at least one non-linear function using combinations of the data received at the hidden layer node (e.g., element). In this manner, the hidden layer may provide intermediate data at an output of one or more hidden layers.

The neural network 150 may have an output layer. The output layer in the example of FIG. 1B may include combiner 160, combiner 162, combiner 164, and combiner 166, although any number of elements may be used. While the processing element in the output stage of the neural network 150 are referred to as combiners, generally the processing elements in the output may perform any combination or other operation using data bits received from a last 'hidden layer' in the neural network. Each element in the output layer may receive as inputs selected bits (e.g., some or all) of the data provided by a last 'hidden layer'. For example, the combiner 160 may receive as inputs from the outputs of combiner 152, combiner 154, combiner 156, and combiner 158. The connections between the hidden layer and the output layer may be weighted. For example, a set of weights W may be specified. There may be one weight for each connection between a hidden layer node and an output layer node in some examples. In some examples, there may be one weight for each hidden layer node that may be applied to the data provided by that node to each connected output node. Other distributions of weights may also be used. The weights may be multiplied with the output of the hidden layer before the output is provided to the output layer. In this manner, the output layer may perform a sum of weighted inputs. Accordingly, an output of the neural network 150 (e.g., the outputs of the output layer) may be referred to as a weighted sum. The output layer may accordingly combine intermediate data received from one or more hidden layers using weights to provide output data.

In some examples, the neural network 150 may be used to provide L output bits which represent processed data corresponding to m input bits. For example, in the example of FIG. 1B, m input bits are shown ($x_1(n)$, $x_2(n)$, ... $x_m(n)$) and L output bits are provided ($y_1(n)$, $y_2(n)$, ... $y_L(n)$). The neural network 150 may be trained such that the weights W used and/or the functions provided by the elements of the hidden layers cause the neural network 150 to provide output bits which represent the processed data corresponding to the m encoded input bits. The input bits may have been encoded with an encoding technique, and the weights and/or functions provided by the elements of the hidden layers may be selected in accordance with the encoding technique. Accordingly, the neural network 150 may be trained multiple times—once for each encoding technique that may be used to provide the neural network 150 with input data.

Examples of neural networks may be trained. Training generally refers to the process of determining weights, functions, and/or other attributes to be utilized by a neural network to create a desired transformation of input data to output data. In some examples, neural networks described herein may be trained to transform encoded input data to decoded data (e.g., an estimate of the decoded data). In some examples, neural networks described herein may be trained to transform noisy encoded input data to decoded data (e.g., an estimate of the decoded data). In this manner, neural networks may be used to reduce and/or improve errors which may be introduced by noise present in the input data.

In some examples, neural networks described herein may be trained to transform noisy encoded input data to encoded data with reduced noise. The encoded data with reduced noise may then be provided to any decoder (e.g., a neural network and/or other decoder) for decoding of the encoded data. In this manner, neural networks may be used to reduce and/or improve errors which may be introduced by noise.

Training as described herein may be supervised or unsupervised in various examples. In some examples, training may occur using known pairs of anticipated input and desired output data. For example, training may utilize known encoded data and decoded data pairs to train a neural network to decode subsequent encoded data into decoded data. In some examples, training may utilize known noisy encoded data and decoded data pairs to train a neural network to decode subsequent noisy encoded data into decoded data. In some examples, training may utilize known noisy encoded data and encoded data pairs to train a neural network to provide encoded data having reduced noise than input noisy encoded data. Examples of training may include determining weights to be used by a neural network, such as neural network 150 of FIG. 1B. In some examples, the same neural network hardware is used during training as will be used during operation. In some examples, however, different neural network hardware may be used during training, and the weights, functions, or other attributes determined during training may be stored for use by other neural network hardware during operation.

Examples of training can be described mathematically. For example, consider input data at a time instant (n), given as: $X(n)=[x_1(n), x_2(n), \ldots x_m(n)]^T$. The center vector for each element in hidden layer(s) of the neural network 150 (e.g., combiner 152, combiner 154, combiner 156, and combiner 158) may be denoted as $C_i$ (for i=1, 2, ..., H, where H is the element number in the hidden layer).

The output of each element in a hidden layer may then be given as:

$$h_i(n)=f_i(\|X(n)-C_i\|) \text{ for } (i=1,2,\ldots,H) \quad (1)$$

The connections between a last hidden layer and the output layer may be weighted. Each element in the output layer may have a linear input-output relationship such that it may perform a summation (e.g., a weighted summation). Accordingly, an output of the i'th element in the output layer at time n may be written as:

$$y_i((n)=\Sigma_{j=1}^H W_{ij}h_j(n)=\Sigma_{j=1}^H W_{ij}f_j(\|X(n)-C_j\|) \quad (2)$$

for (i=1, 2, ..., L) and where L is the element number of the output of the output layer and $W_{ij}$ is the connection weight between the j'th element in the hidden layer and the i'th element in the output layer.

Generally, a neural network architecture (e.g., the neural network 150 of FIG. 1B) may include a number of elements and may have center vectors which are distributed in the input domain such that the neural network may approximate nonlinear multidimensional functions and therefore may approximate forward mapping an inverse mapping between two code words (e.g., from an N-bit input to an L-bit output). Generally, the choice of transfer function used by elements in the hidden layer may not affect the mapping performance of the neural network, and accordingly, a function may be used which may be implemented conveniently in hardware in some examples. For example, a thin-plate-spline function and/or a Gaussian function may be used in various examples and may both provide adequate approximation capabilities. Other functions may also be used.

Examples of neural networks may accordingly be specified by attributes (e.g., parameters). In some examples, two sets of parameters may be used to specify a neural network: connection weights and center vectors (e.g., thresholds). The parameters may be determined from selected input data (e.g., encoded input data) by solving an optimization function. An example optimization function may be given as:

$$E = \sum_{n=1}^{M} \|Y(n) - \hat{Y}(n)\|^2 \quad (3)$$

where M is a number of trained input vector (e.g., trained encoded data inputs) and Y(n) is an output vector computed from the sample input vector using Equations (1) and (2) above, and $\hat{Y}(n)$ is the corresponding desired (e.g., known) output vector. The output vector Y(n) may be written as:

$$Y(n) = [y_1(n), y_2(n), \ldots, y_L(n)]^T$$

Various methods (e.g., gradient descent procedures) may be used to solve the optimization function. However, in some examples, another approach may be used to determine the parameters of a neural network, which may generally include two steps—(1) determining center vectors $C_i$ (i=1, 2, . . . , H) and (2) determining the weights.

In some examples, the center vectors may be chosen from a subset of available sample vectors. In such examples, the number of elements in the hidden layer(s) may be relatively large to cover the entire input domain. Accordingly, in some examples, it may be desirable to apply k-means cluster algorithms. Generally, k-means cluster algorithms distribute the center vectors according to the natural measure of the attractor (e.g., if the density of the data points is high, so is the density of the centers). k-means cluster algorithms may find a set of cluster centers and partition the training samples into subsets. Each cluster center may be associated with one of the H hidden layer elements in this network. The data may be partitioned in such a way that the training points are assigned to the cluster with the nearest center. The cluster center corresponding to one of the minima of an optimization function. An example optimization function for use with a k-means cluster algorithm may be given as:

$$E_{k\_means} = \sum_{j=1}^{H} \sum_{n=1}^{M} B_{jn} \|X(n) - C_j\|^2 \quad (4)$$

where $B_{jn}$ is the cluster partition or membership function forming an H×M matrix. Each column may represent an available sample vector (e.g., known input data) and each row may represent a cluster. Each column may include a single '1' in the row corresponding to the cluster nearest to that training point, and zeros elsewhere.

The center of each cluster may be initialized to a different randomly chosen training point. Then each training example may be assigned to the element nearest to it. When all training points have been assigned, the average position of the training point for each cluster may be found and the cluster center is moved to that point. The clusters may become the desired centers of the hidden layer elements.

In some examples, for some transfer functions (e.g., the Gaussian function), the scaling factor σ may be determined, and may be determined before determining the connection weights. The scaling factor may be selected to cover the training points to allow a smooth fit of the desired network outputs. Generally, this refers to any point within the convex hull of the processing element centers may significantly activate more than one element. To achieve this goal, each hidden layer element may activate at least one other hidden layer element to a significant degree. An appropriate method to determine the scaling parameter σ may be based on the P-nearest neighbor heuristic, which may be given as, $$\sigma_i = \frac{1}{P} \sum_{j=1}^{P} \|C_j - C_i\|^2$$

(i=1, 2, . . . , H) where $C_j$ (for i=1, 2, . . . , H) are the P-nearest neighbors of $C_i$.

The connection weights may additionally or instead be determined during training. In an example of a neural network, such as neural network 150 of FIG. 1B, having one hidden layer of weighted connections an output elements which are summation units, the optimization function of Equation (3) may become a linear least-squares problem once the center vectors and the scaling parameter have been determined. The linear least-squares problem may be written as $$\min_W \sum_{n=1}^{M} \|Y(n) - \hat{Y}(n)\|^2 = \min_W \sum_{n=1}^{M} \|WF - \hat{Y}\|^2 \quad (5)$$

where W={Wij} is the L×H matrix of the connection weights, F is an H×M matrix of the outputs of the hidden layer processing elements and whose matrix elements are computed using $F_{in} = f_i(\|X(n) - C_i\|)$ (i=1, 2, . . . , H; n=1, 2, . . . , M) and $\hat{Y} = [\hat{Y}(1), \hat{Y}(2), \ldots, \hat{Y}(M)]$ is the L×M matrix of the desired (e.g., known) outputs. The connection weight matrix W may be found from Equation (5) and may be written as follows:

$$\hat{W} = \hat{Y}F^+ = \hat{Y} \lim_{\alpha \to 0} F^T (FF^T + \alpha I)^{-1} \quad (6)$$

where $F^+$ is the pseudo-inverse of F. In this manner, the above may provide a batch-processing method for determining the connection weights of a neural network. It may be applied, for example, where all input sample sets are available at one time. In some examples, each new sample set may become available recursively, such as in the recursive-least-squares algorithms (RLS). In such cases, the connection weights may be determined as follows.

First, connection weights may be initialized to any value (e.g., random values may be used). The output vector Y(n) may be computed using Equation (2). The error term $e_i(n)$ of each output element in the output layer may be computed as follows:

$$e_i(n) = y_i(n) - \hat{y}_i(n) \quad (i=1, 2, \ldots, L)$$

The connection weights may then be adjusted based on the error term, for example as follows:

$$W_{ij}(n+1) = W_{ij}(n) + \gamma e_i(n) f_j(\|X(n) - C_j\|)$$

$$(i=1, 2, \ldots, L; j=1, 2, \ldots, M) \quad (7)$$

where γ is the learning-rate parameter which may be fixed or time-varying.

The total error may be computed according to the output from the output layer and the desired (known) data:

$$\epsilon = \|Y(n) - \hat{Y}(n)\|^2 \quad (8)$$

The process may be iterated by again calculating a new output vector, error term, and again adjusting the connection weights. The process may continue until weights are identified which reduce the error to equal to or less than a threshold error.

Accordingly, the neural network 150 of FIG. 1B may be trained to determine parameters (e.g., weights) for use by the neural network 150 to perform a particular mapping between input and output data. For example, training the neural network 150 may provide one set of parameters to use when decoding encoded data that had been encoded with a particular encoding technique (e.g., low density parity check coding (LDPC), Reed-Solomon coding, Bose-Chaudhuri-Hocquenghem (BCH), and/or Polar coding). The neural network 150 (and/or another neural network) may be trained multiple times, using different known input/output data pairs, for example. Multiple trainings may result in multiple sets of connection weights. For example, a different set of weights may be determined for each of multiple encoding techniques—e.g., one set of weights may be determined for use with decoding LDPC encoded data and another set of weights may be determined for use with decoding BCH encoded data.

Recall that the structure of neural network 150 of FIG. 1B is provided by way of example only. Other multilayer neural network structures may be used in other examples. For example, as described below with respect to FIG. 1C, a multilayer recurrent neural network structure may be utilized as disclosed herein. Moreover, the training procedures described herein are also provided by way of example. Other training techniques (e.g., learning algorithms) may be used, for example, to solve the local minimum problem and/or vanishing gradient problem. Determined weights and/or vectors for each decoder may be obtained by an off-line learning mode of the neural network, which may advantageously provide more resources and data. In some implementations, for example as described with reference to FIGS. 2A-2C, the hidden layers of combiners (e.g., combiner 152, combiner 154, combiner 156, and combiner 158) may include multiplication/accumulation (MAC) units, with each layer having additional MAC units. Such implementations, having accumulated the intermediate processing results in a respective processing elements (e.g., the respective MAC unit), may also include memory look-up (MLU) units that are configured to retrieve a plurality of coefficients and provide the plurality of coefficients as the connection weights (e.g., determined weights) for that respective layer of MAC units to be mixed with the input data.

In examples of supervised learning, the input training samples: $[x_1(n), x_2(n), \ldots x_m(n)]$ may be generated by passing the encoded samples $[b_1(n), b_2(n), \ldots b_m(n)]$ through some noisy channels and/or adding noise. The supervised output samples may be the corresponding original code $[a_1(n), a_2(n), \ldots a_L(n)]$ which may be used to generate $[b_1(n), b_2(n), \ldots b_m(n)]$ by the encoder. Once these parameters are determined in offline mode, the desired decoded code-word can be obtained from input data utilizing the neural network (e.g., computing Equation (2)), which may avoid complex iterations and feedback decisions used in traditional error-correcting decoding algorithms. In this manner, neural networks described herein may provide a reduction in processing complexity and/or latency, because some complexity has been transferred to an off-line training process which is used to determine the weights and/or functions which will be used. Further, the same neural network (e.g., the neural network 150 of FIG. 1B) can be used to decode an input code-word encoded from any of multiple error correction encoder by selecting different weights that were obtained by the training for the particular error correction technique employed. In this manner, neural networks may serve as a universal decoder for multiple encoder types.

Figure 1C:
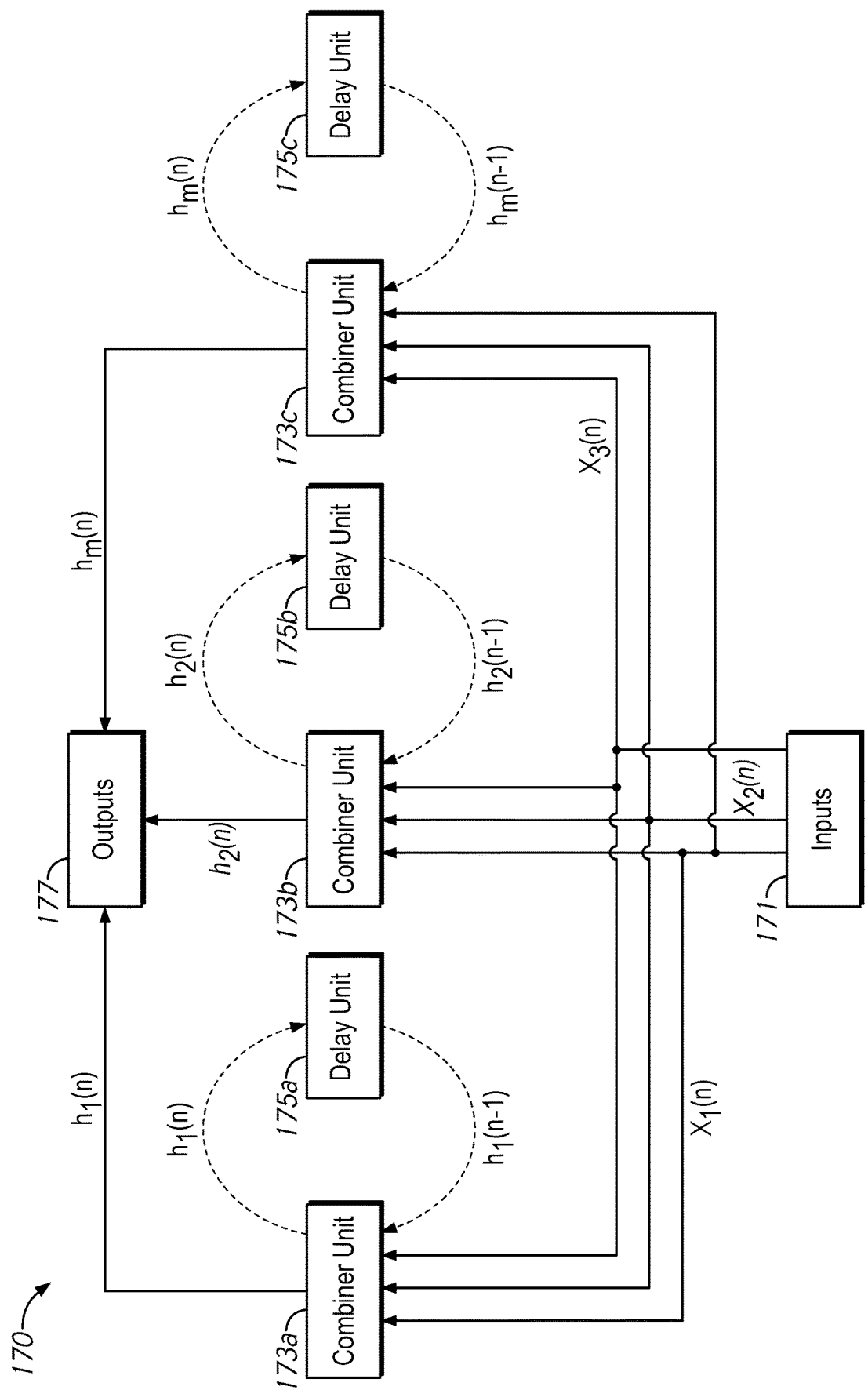
FIG. 1C is a schematic illustration of a recurrent neural network arranged in accordance with examples described herein.

FIG. 1C is a schematic illustration of a recurrent neural network arranged in accordance with examples described herein. The neural network 170 include three stages (e.g., layers): an inputs node 171; a combiner stage 173 and 175, and an outputs node 177. While three stages are shown in FIG. 1C, any number of stages may be used in other examples, e.g., as described with reference to FIGS. 2A-2C. In some implementations, the neural network 170 may have multiple combiner stages such that outputs from one combiner stage is provided to another combiners stage, until being providing to an outputs node 177. As described with reference to FIG. 2A, for example, there may be multiple combiner stages in a neural network 170. As depicted in FIG. 1C, the delay units 175a, 175b, and 175c may be optional components of the neural network 170. When such delay units 175a, 175b, and 175c are utilized as described herein, the neural network 170 may be referred to as a recurrent neural network.

The first stage of the neural network 170 includes inputs node 171. The inputs node 171 may receive input data at various inputs of the recurrent neural network. In some examples, the inputs node 171 may include multiple input nodes, such as input node 168, node 169, node 172, and node 174 of FIG. 1B. The second stage of the neural network 170 is a combiner stage including combiner units 173a, 173b, 173c; and delay units 175a, 175b, 175c. Accordingly, the combiner units 173 and delay units 175 may be collectively referred to as a stage of combiners. In some implementations, the combiner units 173a, 173b, and 173c may corresponds to combiner 152, combiner 154, and combiner 156 of FIG. 1B, for example. Accordingly, as described with respect to FIG. 1B with processing units 112 implementing such combiners, generally processing units 112 that implement the combiner units 173a-c and delay units 175a-c in the second stage may perform a nonlinear activation function using the input data from the inputs node 171 (e.g., input signals $X_1(n)$, $X_2(n)$, and $X_3(n)$). The third stage of neural network 170 includes the outputs node 177. In some examples, the outputs node 177 may include combiner 160, combiner 162, and combiner 164 of FIG. 1B. Accordingly, in some examples, the outputs nodes 177 may be referred to as a stage of combiners. Additional, fewer, and/or different components may be used in other examples.

The recurrent neural network 170 includes delay units 175a, 175b, and 175c, which generate delayed versions of the output from the respective combiner units 173a-c based on receiving such output data from the respective combiner units 173a-c. In the example, the output data of combiner units 173a-c may be represented as h(n); and, accordingly, each of the delay units 175a-c delay the output data of the combiner units 173a-c to generate delayed versions of the output data from the combiner units 173a-c, which may be represented as h(n–t). In various implementations, the amount of the delay, t, may also vary, e.g., one clock cycle, two clock cycles, or one hundred clock cycles. That is, the delay unit 175 may receive a clock signal and utilize the clock signal to identify the amount of the delay. In the example of FIG. 1C, the delayed versions are delayed by one time period, where '1' represents a time period. A time period may correspond to any number of units of time, such as a time period defined by a clock signal or a time period defined by another element of the neural network 170.

Continuing in the example of FIG. 1C, each delay unit 175a-c provides the delayed versions of the output data from the combiner units 173a-c as input to the combiner units 173a-c, to operate, optionally, as a recurrent neural network. Such delay units 175a-c may provide respective delayed versions of the output data from nodes of the combiner units 173a-c to respective input units/nodes of the combiner units 173a-c. In utilizing delayed versions of output data from combiner units 173a-c, the recurrent neural network 170 may train weights at the combiner units 173a-c that incorporate time-varying aspects of input data to be processed by such a recurrent neural network 170. Once trained, in some examples, the inputs node 171 receives encoded input data that is to be decoded in the recurrent neural network 170. For example, each stream of input data may correspond to a different obtained set of encoded data that is representative of a temporal signal. Because an RNN 170 incorporates the delayed versions of output data from combiner units 173a-c, the delayed versions of output data from the combiner units 173a-c provide feedback information representative of the temporal nature, with the RNN 170 providing output decoded faster with the RNN 170 incorporating that temporal nature into calculating the output decoded data. In the example, the output decoded data may be representative of an estimate of the encoded data decoded into the original data that was encoded according to the associated encoding technique.

Generally, a recurrent neural network may include multiple stages of nodes. The nodes may be implemented using processing units (e.g., processing units 112) which may execute one or more functions on inputs received from a previous stage and provide the output of the functions to the next stage of the recurrent neural network. The processing units may be implemented using, for example, one or more processors, controllers, and/or custom circuitry, such as an application specific integrated circuit (ASIC) and/or a field programmable gate array (FPGA). In some examples, the processing units may be implemented using any combination of one or more processing units 112 described with respect to FIGS. 2A-2C. The processing units may be implemented as combiners and/or summers and/or any other structure for performing functions allocated to the processing unit. In some examples, certain of the elements of neural networks described herein perform weighted sums, e.g., may be implemented using one or more multiplication/accumulation units, which may be implemented using processor(s) and/or other circuitry. In an example, the neural network 170 may be implemented by the electronic device 110 utilizing any combination of one or more processing units described with respect to FIGS. 2A-2C.

Examples of recurrent neural network training and inference can be described mathematically. Again, as an example, consider input data at a time instant (n), given as: $X(n)=[x_1(n), x_2(n), \ldots x_m(n)]^T$. The center vector for each element in hidden layer(s) of the recurrent neural network 170 (e.g., combiner units 173 including combiner 152, combiner 154, combiner 156, and combiner 158 of FIG. 1B) may be denoted as $C_i$ (for i=1, 2, . . . , H, where H is the element number in the hidden layer).

The output of each element in a hidden layer may then be given as:

$$h_i(n)=f_i(\|X(n)+h_i(n-t)-C_i\|) \text{ for } (i=1,2, \ldots ,H) \quad (9)$$

t may be the delay at the delay unit 175 such that the output of the combiner units 173 includes a delayed version of the output of the combiner units 173. In some examples, this may be referred to as feedback of the combiner units 173. Accordingly, each of the connections between a last hidden layer and the output layer may be weighted. Each element in the output layer may have a linear input-output relationship such that it may perform a summation (e.g., a weighted summation). Accordingly, an output of the i'th element in the output layer at time n may be written as:

$$y_i(n)=\Sigma_{j=1}^H W_{ij}h_j(n)+W_{ij}h_j(n-t)=\Sigma_{j=1}^H W_{ij}f_i(\|X(n)+h_i(n-t)-C_j\|) \quad (10)$$

for (i=1, 2, . . . , L) and where L is the element number of the output of the output layer and $W_{ij}$ is the connection weight between the j'th element in the hidden layer and the i'th element in the output layer.

Additionally or alternatively, while FIG. 1C has been described with respect to a single stage of combiners (e.g., second stage) including the combiner units 173a-c and delay units 175a-c, it can be appreciated that multiple stages of similar combiner stages may be included in the neural network 170 with varying types of combiner units and varying types of delay units with varying delays, for example, as will now be described with reference to FIGS. 2A-2C. Further, the same neural network (e.g., the neural network 170 of FIG. 1C) can be used to decode an input code-word encoded from any of multiple error correction encoder by selecting different weights that were obtained by the training for the particular error correction technique employed. In this manner, recurrent neural networks may serve as a universal decoder for multiple encoder types, like the neural network 150. Advantageously, the recurrent neural network 170 utilizes delayed versions of output data from combiner units 173a-c, to provide feedback information representative of a temporal nature. As such, the RNN 170 may provide output data decoded faster with the RNN 170, e.g. as compared to the neural network 150. For example, if a particular encoding technique is susceptible to noise during storing in a memory 140 or memory 145 (e.g., bit flips), obtained encoded data to be decoded by the RNN 170 may include noise that produces a time-varying effect on the obtained encoded data (e.g., temporal nature). Accordingly, the feedback information included in the delayed versions of output data may improve the efficiency of the RNN 170 (e.g., as compared to a neural network 150), to decode the data into decode data, e.g., an estimate of the encoded data as having been decoded in accordance with a decoding technique complementary to the encoding technique.

Figure 2A:
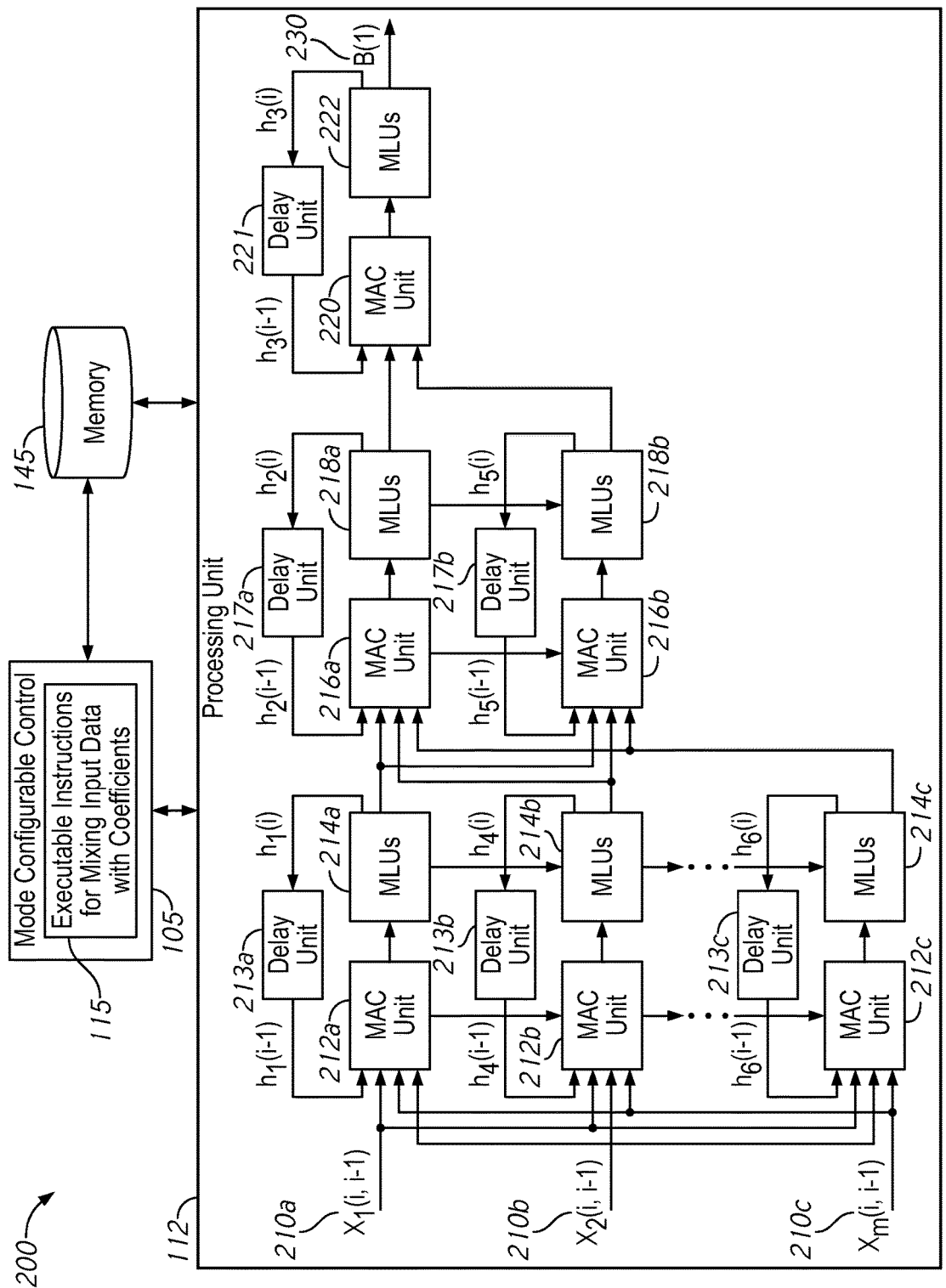
FIGS. 2A-2C are schematic illustrations of processing units arranged in systems in accordance with examples described herein.

FIG. 2A is a schematic illustration of a processing unit 112 arranged in a system 200 in accordance with examples described herein. Such a hardware implementation (e.g., system 200) may be used, for example, to implement one or more neural networks, such as the recurrent neural network 170 of FIG. 1C. Additionally or alternatively, in some implementations, the processing unit 112 may receive input data 210a, 210b, and 210c from such a computing system. The input data 210a, 210b, and 210c may be encoded data obtained from a sensor or data stored in the memory 145. In some examples, encoded data stored in the memory 140 or memory 145 may be obtained as input data to be provided to the electronic device 110 in which the processing unit 112 is implemented. Accordingly, the input data obtained may be m bits of noisy encoded input data that is provided to an input stage (e.g., an input layer) of the processing unit, with the input data 210a $X_1(i)$ corresponding to the first bit; the input data 210b $X_2(i)$ corresponding to the second bit; and the input data 210c $X_m(i)$ corresponding to the m'th bit. In some examples, the obtained input data may be data encoded in accordance with an encoding technique (e.g., low density parity check coding (LDPC), Reed-Solomon coding, Bose-Chaudhuri-Hocquenghem (BCH), and/or Polar coding). Additionally or alternatively, in some implementations, the input data may be noisy due to noise experienced during storing of the encoded data in the memory 140 or memory 145 (e.g., bit flips). Thus, one or more processing units 112 may implement a decoding functionality or decoding operation for the received noisy encoded input data at an electronic device 110.

As denoted in the representation of the input data signals, the input data 210a $X_1(i, i-1)$ includes a current portion of the input data, at time i, and a previous portion of the input data, at time i–1. For example, a current portion of the input data may be a sample obtained at a certain time period (e.g., at time i), while a previous portion of the input data may be a sample obtained at a time period previous to the certain time period (e.g., at time i–1). Accordingly, the previous portion of the input data may be referred to as a time-delayed version of the current portion of the input data. The portions of the input data at each time period may be obtained in a vector or matrix format, for example. In an example, a current portion of the input data, at time i, may be a single value; and a previous portion of the input data, at time i–1, may be a single value. Thus, the input data 210a $X_1(i, i-1)$ may be a vector. In some examples, the current portion of the input data, at time i, may be a vector value; and a previous portion of the input data, at time i–1, may be a vector value. Thus, the input data 210a $X_1(i, i-1)$ may be a matrix.

The processing unit 112 may include multiplication unit/accumulation (MAC) units 212a-c, 216a-b, and 220; delay units 213a-c, 217a-b, and 221; and memory lookup units (MLUs) 214a-c, 218a-b, and 222 that, when mixed with input data obtained from the memory 145, may generate output data (e.g. B(1)) 230. Each set of MAC units and MLU units having different element numbers may be referred to as a respective stage of combiners for the processing unit 112. For example, a first stage of combiners includes MAC units 212a-c and MLUs 214a-c, operating in conjunction with delay units 213a-c, to form a first stage or "layer," as referenced with respect to FIG. 1B having "hidden" layers as various combiner stages. Continuing in the example, the second stage of combiners includes MAC units 216a-b and MLUs 218a-b, operating in conjunction with delay units 217a-b, to form a second stage or second layer of hidden layers. And the third stage of combiners may be a single combiner including the MAC unit 220 and MLU 222, operating in conjunction with delay unit 221, to form a third stage or third layer of hidden layers.

In an example of input data being encoded in accordance with an encoding technique, the output data 230 B(1) may be the decoded data (e.g., an estimate of the decoded data) corresponding to the encoded input data in some examples. For example, the output data may be the data corresponding to the encoded input data, but having reduced and/or modified noise. In operation, the processing unit 112, may provide instructions 115, stored at the mode configurable control 105, to cause the processing unit 112 to configure the multiplication units 212a-c, 216a-c, and 220 to multiply and/or accumulate input data 210a, 210b, and 210c and delayed versions of processing results from the delay units 213a-c, 217a-b, and 221 (e.g., respective outputs of the respective layers of MAC units) with coefficient data to generate the output data 230 B(1). For example, the mode configurable control 105 may execute instructions that cause the memory 145 to provide weights and/or other parameters stored in the memory 145, which may be associated with a certain encoding technique, to the MLUs 214a-c, 218a-b, and 222 as weights for the MAC units 212a-c, 216a-b, and 220 and delay units 213a-c, 217a-b, and 221. During operation, the mode configuration control 105 may be used to select weights and/or other parameters in memory 145 based on an indicated encoding technique for the processing unit 112.

As denoted in the representation of the respective outputs of the respective layers of MAC units (e.g, the outputs of the MLUs 214a-c, 218a-b, and 222), the input data to each MAC unit 212a-c, 216a-b, and 220 includes a current portion of input data, at time i, and a delayed version of a processing result, at time i–1. For example, a current portion of the input data may be a sample obtained at a certain time period (e.g., at time i), while a delayed version of a processing result (e.g., at time i–1) may be obtained from the output of the delay units 213a-c, 217a-b, and 221, which is representative of a time period previous to the certain time period (e.g., as a result of the introduced delay). Accordingly, in using such input data, obtained from both a current period and at least one previous period, output data 230 B(1) may be representative of a Markov process, such that a causal relationship between at least data from a current time period and a previous time period may improve the accuracy of weight estimation for training of coefficient data to be utilized by the MAC units and MLUs of the processing unit 112 or inference of encoded input data or noisy encoded input data in utilizing the processing unit 112. Accordingly, in utilizing delayed versions of output data from 213a-c, 217a-b, and 221 the recurrent neural network 170 provides decoded data (e.g., an estimate of the decoded data), which may have reduced and/or modified noise. Therefore, a recurrent neural network 170 may operate more efficiently to decode noisy encoded input data, e.g., data that may have been stored in a memory cells of a degraded memory device where bit flips have occurred.

In an example of executing such instructions 115 for mixing encoded input data with coefficients, at a first layer of the MAC units 212a-c and MLUs 214a-c, the multiplication unit/accumulation units 212a-c are configured to multiply and accumulate at least two operands from corresponding input data 210a, 210b, or 210c and an operand from a respective delay unit 213a-c to generate a multiplication processing result that is provided to the MLUs 214a-c. For example, the multiplication unit/accumulation units 212a-c may perform a multiply-accumulate operation such that three operands, M N, and T are multiplied and then added with P to generate a new version of P that is stored in its respective MLU 214a-c. Accordingly, the MLU 214a latches the multiplication processing result, until such time that the stored multiplication processing result is be provided to a next layer of MAC units. The MLUs 214a-c, 218a-b, and 222 may be implemented by any number of processing elements that operate as a memory look-up unit such as a D, T, SR, and/or JK latches.

The MLUs 214a-c, 218a-b, and 222 shown in FIG. 2A may generally perform a predetermined nonlinear mapping from input to output. For example, the MLUs 214a-c, 218a-b, and 222 may be used to evaluate at least one non-linear function. In some examples, the contents and size of the various MLUs 214a-c, 218a-b, and 222 depicted may be different and may be predetermined. In some examples, one or more of the MLUs 214a-c, 218a-b, and 222 shown in FIG. 2A may be replaced by a single consolidated MLU (e.g., a table look-up). Examples of nonlinear mappings (e.g., functions) which may be performed by the MLUs 214a-c, 218a-b, and 222 include Gaussian functions, piecewise linear functions, sigmoid functions, thin-plate-spline functions, multiquadratic functions, cubic approximations, and inverse multi-quadratic functions. Examples of functions have been described with reference also to FIG. 1B. In some examples, selected MLUs 214a-c, 218a-b, and 222 may be by-passed and/or may be de-activated, which may allow an MLU and its associated MAC unit to be considered a unity gain element.

Additionally in the example, the MLU 214a provides the processing result to the delay unit 213a. The delay unit 213a delays the processing result (e.g., $h_1(i)$) to generate a delayed version of the processing result (e.g, $h_1(i-1)$) to output to the MAC unit 212a as operand T. While the delay units 213a-c, 217a-b, and 221 of FIG. 2A are depicted introducing a delay of '1', it can be appreciated that varying amounts of delay may be introduced to the outputs of first layer of MAC units. For example, a clock signal that introduced a sample delay of '1' (e.g., $h_1(i-1)$) may instead introduce a sample delay of '2', '4', or '100'. In various implementations, the delay units 213a-c, 217a-b, and 221 may correspond to any number of processing units that can introduce a delay into processing circuitry using a clock signal or other time-oriented signal, such as flops (e.g., D-flops) and/or one or more various logic gates (e.g., AND, OR, NOR, etc. . . . ) that may operate as a delay unit.

In the example of a first hidden layer of a recurrent neural network, the MLUs 214a-c may retrieve coefficient data stored in the memory 145, which may be weights associated with weights to be applied to the first layer of MAC units to both the data from the current period and data from a previous period (e.g., the delayed versions of first layer processing results). For example, the MLU 214a can be a table look-up that retrieves one or more coefficients (e.g., specific coefficients associated with a first frequency) to be applied to both operands M and N, as well as an additional coefficient to be applied to operand T. The MLUs 214a-c also provide the generated multiplication processing results to the next layer of the MAC units 216a-b and MLUs 218a-b. The additional layers of the MAC units 216a, 216b and MAC unit 220 working in conjunction with the MLUs 218a, 218b and MLU 222, respectively, may continue to process the multiplication results to generate the output data 230 B(1). Using such a circuitry arrangement, the output data 230 B(1) may be generated from the input data 210a, 210b, and 210c.

Figure 2B:
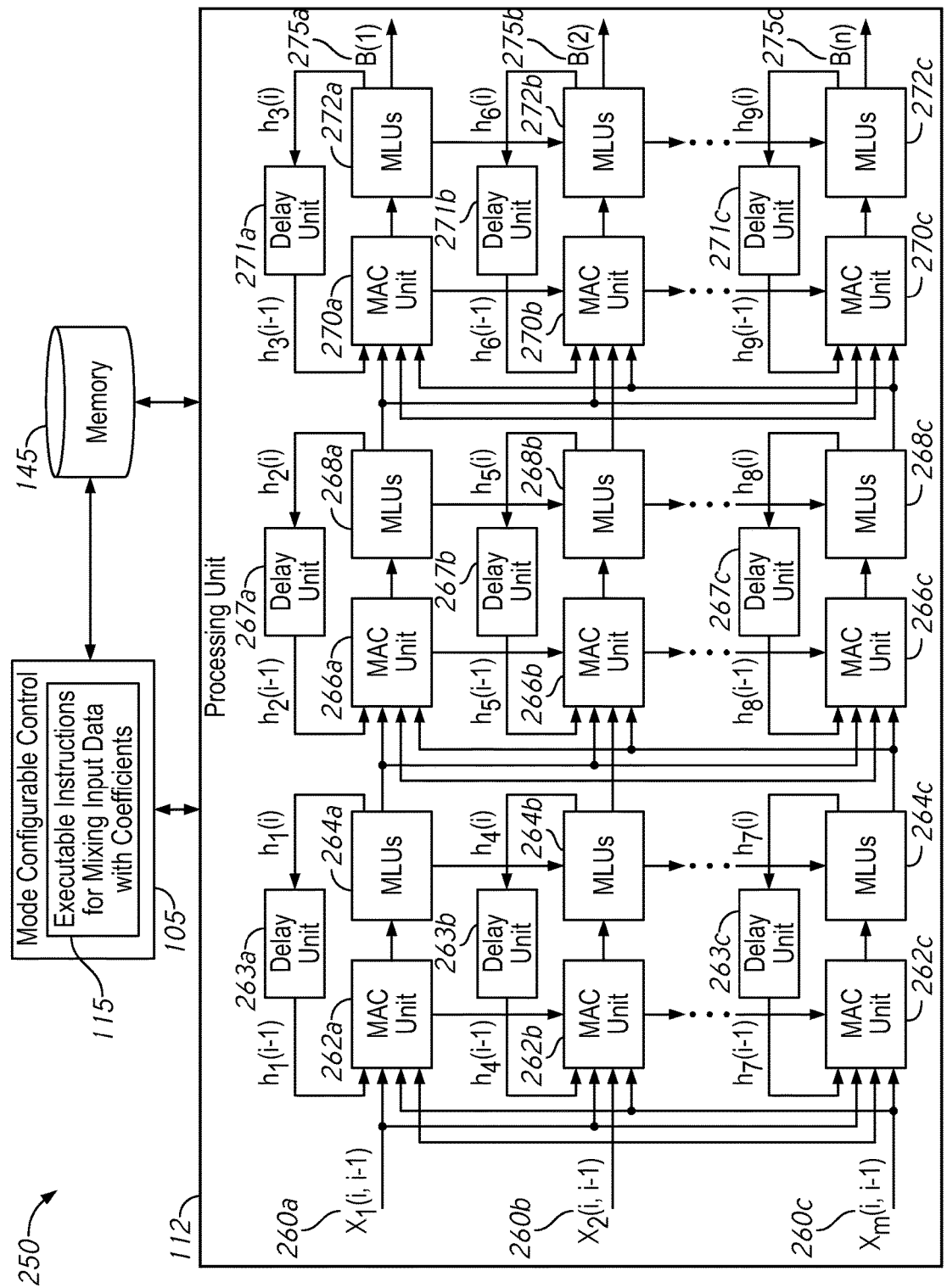

Advantageously, the processing unit 112 of system 200 may utilize a reduced number of MAC units and/or MLUs, e.g., as compared to the processing unit 112 of FIG. 2B. Each subsequent layer may have a reduced portion of MAC units, delay units, and MLUs. As depicted, in FIG. 2A for example, a second layer of MAC units 216a-b, delay unit 217a-b, and MLUs 218a-b may include m−1 MAC units and MLUs, when m=3. Accordingly, the last layer in the processing unit 112, including the MAC unit 220, delay unit 221, and MLU 222, includes only one MAC, one delay unit, and one MLU.

The coefficient data, for example from memory 145, can be mixed with the input data 210a-210c and delayed version of processing results to generate the output data 230 B(1). For example, the relationship of the coefficient data to the output data 230 B(1) based on the input data 210a-c and the delayed versions of processing results may be expressed as:

$$B(1)=a^1 * f(\Sigma_{j=1}^{m-1} a^{(m-1)} f_j(\Sigma_{k=1}^{m} a^{(m)} X_k(i))) \quad (11)$$

where $a^{(m)}$, $a^{(m-1)}$, $a^1$ are coefficients for the first layer of multiplication/accumulation units 212a-c and outputs of delay units 213a-c; the second layer of multiplication/accumulation units 216a-b and outputs of delay units 217a-b; and last layer with the multiplication/accumulation unit 220 and output of delay unit 221, respectively; and where f(•) is the mapping relationship which may be performed by the memory look-up units 214a-c and 218a-b. As described above, the memory look-up units 214a-c and 218a-b retrieve coefficients to mix with the input data and respective delayed versions of each layer of MAC units. Accordingly, the output data may be provided by manipulating the input data and delayed versions of the MAC units with the respective multiplication/accumulation units using a set of coefficients stored in the memory. The set of coefficients may be associated with a desired encoding technique. The resulting mapped data may be manipulated by additional multiplication/accumulation units and additional delay units using additional sets of coefficients stored in the memory associated with the desired encoding technique. The sets of coefficients multiplied at each stage of the processing unit 112 may represent or provide an estimation of the processing of the input data in specifically-designed hardware (e.g., an FPGA).

Further, it can be shown that the system 200, as represented by Equation (11), may approximate any nonlinear mapping with arbitrarily small error in some examples and the mapping of system 200 may be determined by the coefficients $a^{(m)}$, $a^{(m-1)}$, $a^1$. For example, if such coefficient data is specified, any mapping and processing between the input data 210a-210c and the output data 230 may be accomplished by the system 200. For example, the coefficient data may represent non-linear mappings of the input data 210a-c to the output data B(1) 230. In some examples, the non-linear mappings of the coefficient data may represent a Gaussian function, a piece-wise linear function, a sigmoid function, a thin-plate-spline function, a multi-quadratic function, a cubic approximation, an inverse multi-quadratic function, or combinations thereof. In some examples, some or all of the memory look-up units 214a-c, 218a-b may be deactivated. For example, one or more of the memory look-up units 214a-c, 218a-b may operate as a gain unit with the unity gain. Such a relationship, as derived from the circuitry arrangement depicted in system 200, may be used to train an entity of the computing system 200 to generate coefficient data. For example, using Equation (11), an entity of the computing system 200 may compare input data to the output data to generate the coefficient data.

Each of the multiplication unit/accumulation units 212a-c, 216a-b, and 220 may include multiple multipliers, multiple accumulation unit, or and/or multiple adders. Any one of the multiplication unit/accumulation units 212a-c, 216a-b, and 220 may be implemented using an ALU. In some examples, any one of the multiplication unit/accumulation units 212a-c, 216a-b, and 220 can include one multiplier and one adder that each perform, respectively, multiple multiplications and multiple additions. The input-output relationship of a multiplication/accumulation unit 212a-c, 216a-b, and 220 may be represented as:

$$B_{out} = \sum_{i=1}^{I} C_i * B_{in}(i) \quad (12)$$

where "I" represents a number to perform the multiplications in that unit, $C_i$ the coefficients which may be accessed from a memory, such as memory 145, and $B_{in}(i)$ represents a factor from either the input data 210a-c or an output from multiplication unit/accumulation units 212a-c, 216a-b, and 220. In an example, the output of a set of multiplication unit/accumulation units, $B_{out}$, equals the sum of coefficient data, $C_i$ multiplied by the output of another set of multiplication unit/accumulation units, $B_{in}(i)$. $B_{in}(i)$ may also be the input data such that the output of a set of multiplication unit/accumulation units, $B_{out}$, equals the sum of coefficient data, $C_i$ multiplied by input data.

Accordingly, the system 200 (e.g., a hardware implementation of recurrent neural network 170) may be used to convert an input code word (e.g. $x_1(n)$, $x_2(n)$, . . . $x_m(n)$) to an output code word (e.g., B(1). Examples of the conversion have been described herein with reference to FIG. 1C. For example, the input code word may correspond to noisy encoded input data. A hardware implementation of recurrent neural network 170 may utilize multiplication with corresponding weights (e.g., weights obtained during training) and MLUs to provide the output code word. The output code word may correspond to the decoded data and/or to a version of the encoded input data having reduced and/or changed noise.

The mode configuration control 105 may be implemented using circuitry (e.g., logic), one or more processor(s), microcontroller(s), controller(s), or other elements. The mode configuration control 105 may select certain weights and/or other parameters from memory 145 and provide those weights and/or other parameters to one or more of the MAC units and/or MLUs of FIG. 2A. In some examples, weights and/or other parameters stored in memory 145 may be associated with particular encoding techniques. During operation, the mode configuration control 105 may be used to select weights and/or other parameters in memory 145 associated with a particular encoding technique (e.g., Reed-Solomon coding, BCH coding, LDPC coding, and/or Polar coding). A hardware implementation of recurrent neural network 170 may then utilize the selected weights and/or other parameters to function as a decoder for data encoded with that encoding technique. The mode configuration control 105 may select different weights and/or other parameters stored in memory 145 which are associated with a different encoding technique to alter the operation of the hardware implementation of recurrent neural network 170 to serve as a decoder for the different encoding technique. In this manner, the hardware implementation of recurrent neural network 170 may flexibly function as a decoder for multiple encoding techniques.

FIG. 2B is a schematic illustration of a processing unit 112 arranged in a system 250 in accordance with examples described herein. Such a hardware implementation (e.g., system 250) may be used, for example, to implement one or more neural networks, such as the recurrent neural network 170 of FIG. 1C. Additionally or alternatively, in some implementations, the processing unit 112 may receive input data 210a, 210b, and 210c from a computing system. Similarly described elements of FIG. 2B may operate as described with respect to FIG. 2A, but may also include additional features as described with respect to FIG. 2B. For example, FIG. 2B depicts MAC units 262a-c and delay units 263a-c that may operate as described with respect MAC units 212a-c and delay units 213a-c of FIG. 2A. Accordingly, elements of FIG. 2B, whose numerical indicator is offset by 50 with respect to FIG. 2A, include similarly elements of the processing element 112; e.g., MAC unit 266a operates similarly with respect to MAC unit 216a. The system 250, including processing element 112, also includes additional features not highlighted in the processing element 112 of FIG. 2A. For example, the processing unit 112 of FIG. 2B additionally includes MAC units 266c and 270b-c; delay units 267c and 271b-c; and MLUs 268c and 272b-c, such that the output data is provided as 275a-c, rather than as singularly in FIG. 2A as B(1) 230. Advantageously, the system 250 including a processing element 112 may process the input data 260a-c to generate the output data 275a-c with greater precision. For example, the output data 275a-c may process the input data 260a-260c with additional coefficient retrieved at MLU 268c and multiplied and/or accumulated by additional MAC units 266c and 270b-c and additional delay units 267c and 271b-c. For example, such additional processing may result in output data that is more precise with respect providing output data that is an estimate of decoded data (e.g., as compared to output data obtained from the processing unit 112 of FIG. 2A). In implementations where board space (e.g., a printed circuit board) is not a primary factor in design, implementations of the processing unit 112 of FIG. 2B may be desirable as compared to that of processing unit 112 of FIG. 2A; which, in some implementations may occupy less board space as a result of having fewer elements than the processing unit 112 of FIG. 2B.

While processing element 112 is described in the context of FIGS. 2A and 2B as a single processing element 112, the features may also be implemented in the processing elements 112 of FIG. 1A, such that the description of the single processing element 112 in FIG. 2A or 2B is interchangeable as a processing element as implemented throughout the examples described herein. Therefore, it can be appreciated that, while referring to a single processing element 112 in FIG. 2A or 2B, the electronic device 110 may have multiple processing elements 112, like FIG. 1A, to also have the same features as described with respect a single processing element 112 of FIG. 2A or 2B.

Figure 2C:
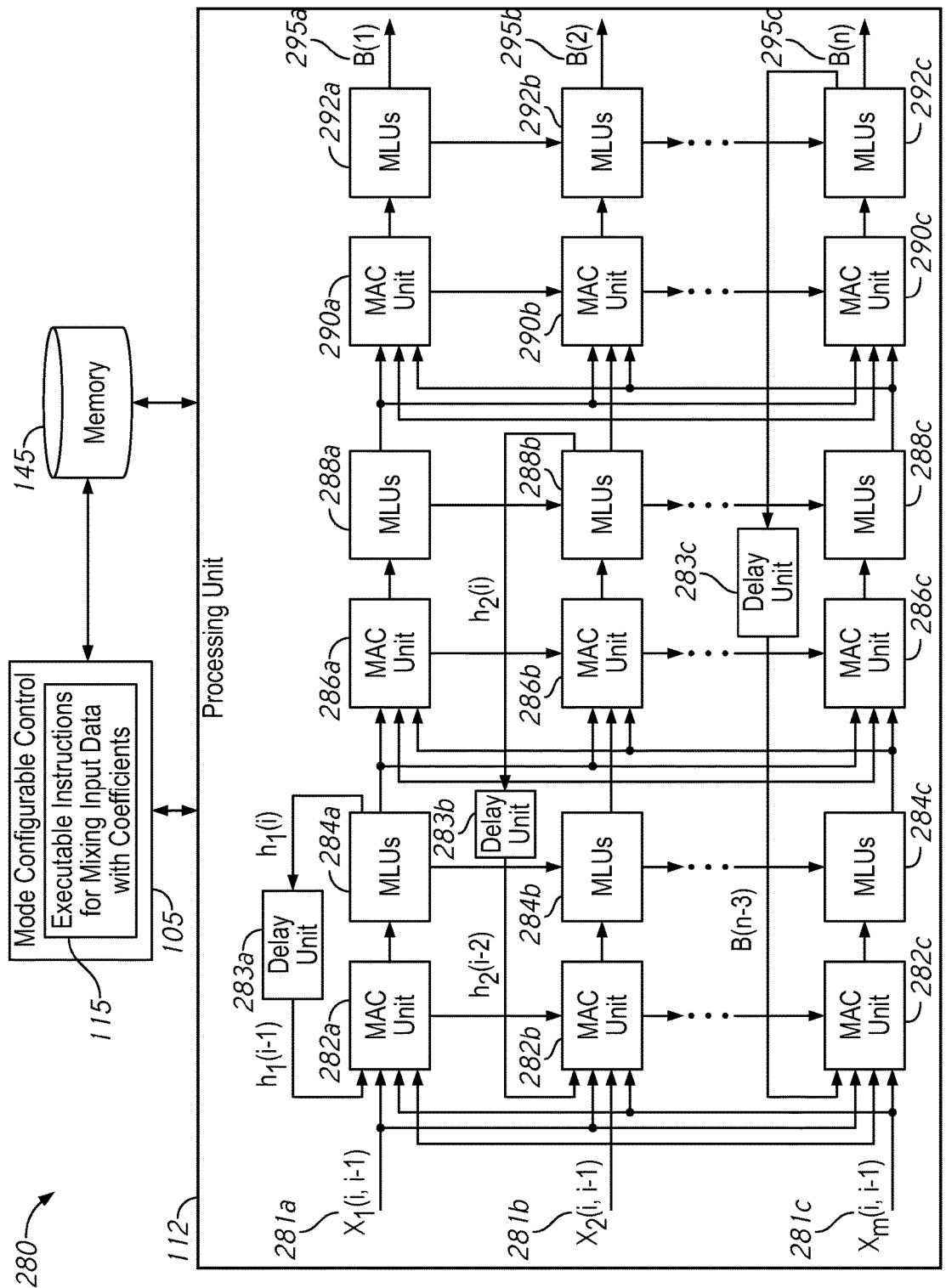

FIG. 2C is a schematic illustration of a processing unit 112 arranged in a system 280 in accordance with examples described herein. Such a hardware implementation (e.g., system 280) may be used, for example, to implement one or more neural networks, such as the recurrent neural network 170 of FIG. 1C. Additionally or alternatively, in some implementations, the processor unit 112 may be implemented as a processing unit 112 in the example of FIG. 1A. Similarly described elements of FIG. 2C may operate as described with respect to FIG. 2B, except for the delay units 263a-c, 267a-c, and 271a-c of FIG. 2B. For example, FIG. 2C depicts MAC units 282a-c and delay units 283a-c that may operate as described with respect to MAC units 262a-c and delay units 263a-c of FIG. 2B. Accordingly, elements of FIG. 2C, whose numerical indicator is offset by 20 with respect to FIG. 2B, include similarly elements of the processing element 112; e.g., MAC unit 286a operates similarly with respect to MAC unit 266a.

The system 280, including processing element 112, also includes additional features not highlighted in the processing element 112 of FIG. 2B. Different than FIG. 2B, FIG. 2C depicts delay units 283a, 283b, and 283c. Accordingly, the processing unit of FIG. 2C illustrate that processing units 112 may include varying arrangements to the placement of the inputs and outputs of delay units, as illustrated with delay units 283a, 283b, and 283c. For example, the output of MLUs 288b may be provided to delay unit 283b, to generate a delayed version of that processing result from the second layer of MAC units, as an input to the first layer of MAC units, e.g., as an input to MAC unit 282b. Accordingly, the processing unit 112 of system 280 is illustrative that delayed versions of processing results may be provided as inputs to other hidden layers, different than the processing unit 112 of system 250 in FIG. 2B showing respective delayed versions being provided as inputs to the same layer in which those delayed versions were generated (e.g., the output of MLU 268b is provided to delay unit 267b, to generate a delayed version for the MAC unit 266b in the same layer from which the processing result was outputted).

Therefore, in the example, even the output B(n) 295c may be provided, from the last hidden layer, to the first hidden layer (e.g., as an input to MAC unit 282c).

Advantageously, such delayed versions of processing results, which may be provided as inputs to different or additional hidden layers, may better compensate "higher-order" memory effects in a recurrent neural network 170 that implements one or more processing units 112 of FIG. 2C, e.g., as compared to the processing unit(s) 112 of FIG. 2A or 2B. For example, higher-order memory effects model the effects of leading and lagging envelope signals used during training of the recurrent neural network 170, to transform obtained noisy encoded input data at the processing unit(s) 112 into decoded data (e.g., an estimate of the decoded data). The obtained encoded input data, in being stored in a memory 140 or memory 145 with noise (e.g., bit flips) or other noises experienced during storage (e.g., shot or voltage noise) may be noisy encoded input data to be decoded by the recurrent neural network 170. In the example, a recurrent neural network 170 that estimates the output data may include varying delayed versions of processing results that corresponds to such leading and lagging envelopes (e.g., of various envelopes encapsulating the noise(s)). Accordingly, implementing the processing unit 112 incorporates such higher-order memory effects, e.g., for an inference of a recurrent neural network 170, to provide output data 295a-c based on input data 281a-c.

While processing element 112 is described in the context of FIGS. 2A, 2B, and 2C as a single processing element 112, the features may also be implemented in the processing elements 112 of FIG. 1A, such that the description of the single processing element 112 in FIG. 2A, 2B, 2C is interchangeable as a processing element as implemented throughout the examples described herein. Therefore, it can be appreciated that, while referring to a single processing element 112 in FIGS. 2A, 2B, 2C the electronic device 110 may have multiple processing elements 112, like FIG. 1A, to also have the same features as described with respect a single processing element 112 of FIG. 2A, 2B, or 2C.

Figure 3:
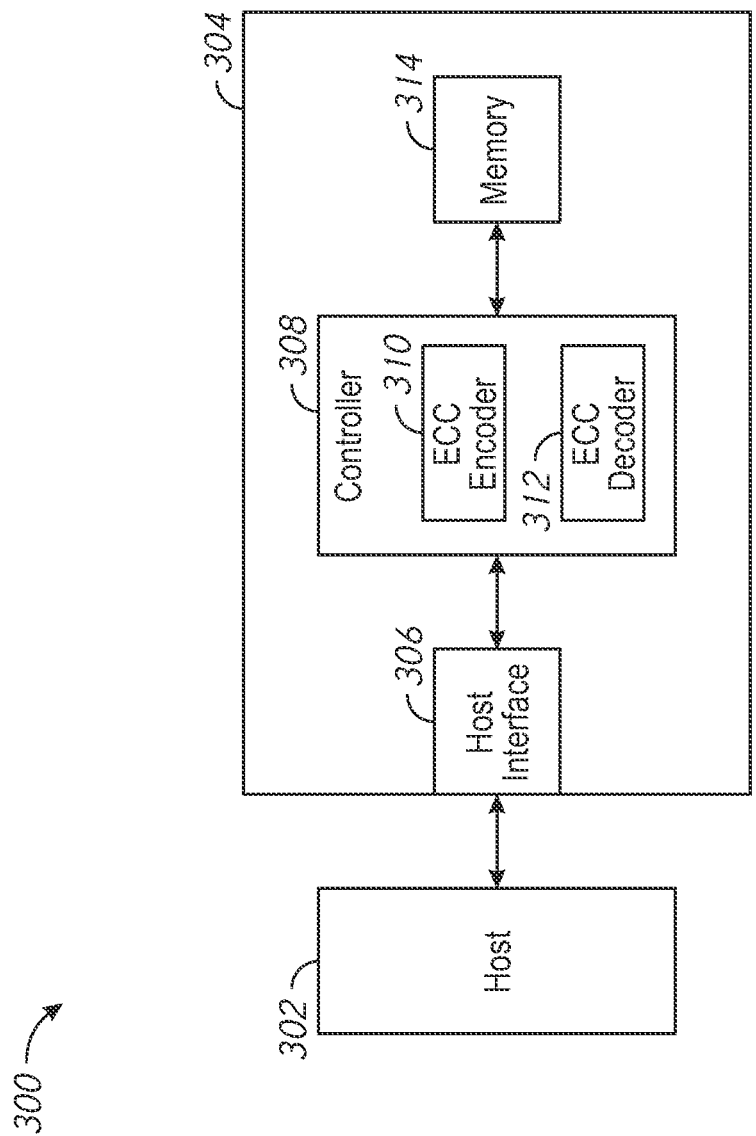
FIG. 3 is a schematic illustration of an apparatus arranged in accordance with examples described herein.

FIG. 3 is a schematic illustration of apparatus 300 (e.g., an integrated circuit, a memory device, a memory system, an electronic device or system, a smart phone, a tablet, a computer, a server, an appliance, a vehicle, etc.) according to an embodiment of the disclosure. The apparatus 300 may generally include a host 302 and a memory system 304.

The host 302 may be a host system such as a personal laptop computer, a desktop computer, a digital camera, a mobile telephone, or a memory card reader, among various other types of hosts. The host 302 may include a number of memory access devices (e.g., a number of processors). The host 302 may also be a memory controller, such as where memory system 304 is a memory device (e.g., a memory device having an on-die controller).

The memory system 304 may be a solid state drive (SSD) or other type of memory and may include a host interface 306, a controller 308 (e.g., a processor and/or other control circuitry), and a number of memory device(s) 314. The memory system 304, the controller 308, and/or the memory device(s) 314 may also be separately considered an "apparatus." The memory device(s) 314 may include a number of solid state memory devices such as NAND flash devices, which may provide a storage volume for the memory system 304. Other types of memory may also be used.

The controller 308 may be coupled to the host interface 306 and to the memory device(s) 314 via a plurality of channels to transfer data between the memory system 304 and the host 302. The interface 306 may be in the form of a standardized interface. For example, when the memory system 304 is used for data storage in the apparatus 300, the interface 306 may be a serial advanced technology attachment (SATA), peripheral component interconnect express (PCIe), or a universal serial bus (USB), among other connectors and interfaces. In general, interface 306 provides an interface for passing control, address, data, and other signals between the memory system 304 and the host 302 having compatible receptors for the interface 306.

The controller 308 may communicate with the memory device(s) 314 (which in some embodiments can include a number of memory arrays on a single die) to control data read, write, and erase operations, among other operations. The controller 308 may include a discrete memory channel controller for each channel (not shown in FIG. 3) coupling the controller 308 to the memory device(s) 314. The controller 308 may include a number of components in the form of hardware and/or firmware (e.g., one or more integrated circuits) and/or software for controlling access to the memory device(s) 314 and/or for facilitating data transfer between the host 302 and memory device(s) 314.

The controller 308 may include an ECC encoder 310 for encoding data bits written to the memory device(s) 314 using one or more encoding techniques. The ECC encoder 310 may include a single parity check (SPC) encoder, and/or an algebraic error correction circuit such as one of the group including a Bose-Chaudhuri-Hocquenghem (BCH) ECC encoder and/or a Reed Solomon ECC encoder, among other types of error correction circuits. The controller 308 may further include an ECC decoder 312 for decoding encoded data, which may include identifying erroneous cells, converting erroneous cells to erasures, and/or correcting the erasures. The memory device(s) 314 may, for example, include one or more output buffers which may read selected data from memory cells of the memory device(s) 314. The output buffers may provide output data, which may be provided as encoded input data to the ECC decoder 312. The neural network 150 of FIG. 1B and/or neural network 170 of FIG. 1C (e.g., as implemented by one or more processing units of FIGS. 2A-2C) may be used to implement the ECC decoder 312 of FIG. 3, for example. In various embodiments, the ECC decoder 312 may be capable of decoding data for each type of encoder in the ECC encoder 310. For example, the memory 145 of FIG. 2A, 2B, or 2C may store parameters associated with multiple encoding techniques which may be used by the ECC encoder 310, such that the hardware implementation of neural network 150 or recurrent neural network 170 may be used as a 'universal decoder' to decode input data encoded by the ECC encoder 310, using any of multiple encoding techniques available to the ECC encoder.

The ECC encoder 310 and the ECC decoder 312 may each be implemented using discrete components such as an application specific integrated circuit (ASIC) or other circuitry, or the components may reflect functionality provided by circuitry within the controller 308 that does not necessarily have a discrete physical form separate from other portions of the controller 308. Although illustrated as components within the controller 308 in FIG. 3, each of the ECC encoder 310 and ECC decoder 312 may be external to the controller 308 or have a number of components located within the controller 308 and a number of components located external to the controller 308.

The memory device(s) 314 may include a number of arrays of memory cells (e.g., non-volatile memory cells). The arrays can be flash arrays with a NAND architecture, for example. However, embodiments are not limited to a particular type of memory array or array architecture. Floating-gate type flash memory cells in a NAND architecture may be used, but embodiments are not so limited. The cells may be multi-level cells (MLC) such as triple level cells (TLC) which store three data bits per cell. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

According to a number of embodiments, controller 308 may control encoding of a number of received data bits according to the ECC encoder 310 that allows for later identification of erroneous bits and the conversion of those erroneous bits to erasures. The controller 308 may also control programming the encoded number of received data bits to a group of memory cells in memory device(s) 314.

The apparatus shown in FIG. 3 may be implemented in any of a variety of products employing processors and memory including for example cameras, phones, wireless devices, displays, chip sets, set top boxes, gaming systems, vehicles, and appliances. Resulting devices employing the memory system may benefit from examples of neural networks described herein to perform their ultimate user function.

From the foregoing it will be appreciated that, although specific embodiments have been described herein for purposes of illustration, various modifications may be made while remaining with the scope of the claimed technology. Certain details are set forth herein to provide an understanding of described embodiments of technology. However, other examples may be practiced without various of these particular details. In some instances, well-known circuits, control signals, timing protocols, neural network structures, algorithms, and/or software operations have not been shown in detail in order to avoid unnecessarily obscuring the described embodiments. Other embodiments may be utilized, and other changes may be made, without departing from the spirit or scope of the subject matter presented here.

Figure 4:
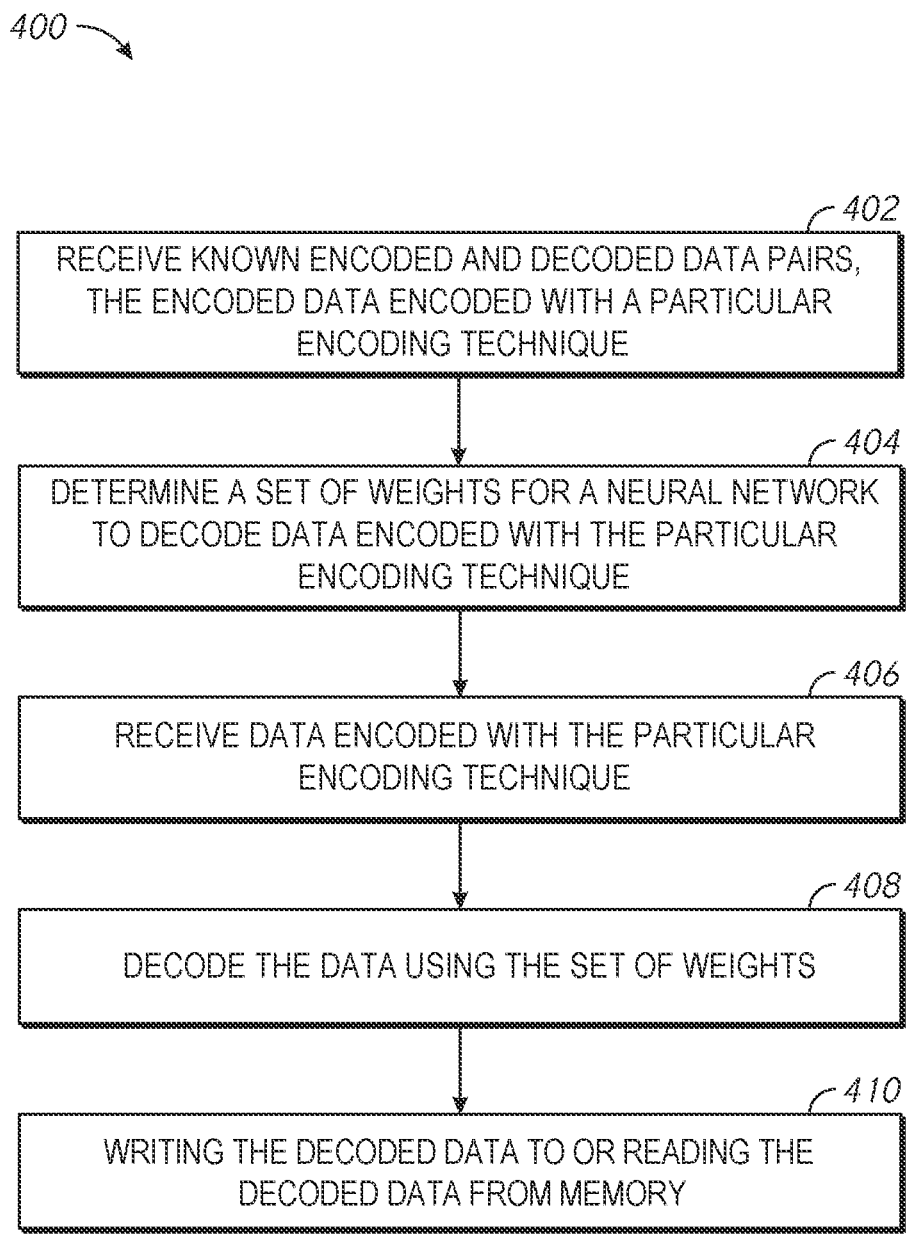
FIGS. 4 and 5 are flowcharts of methods arranged in accordance with examples described herein.

FIG. 4 is a flowchart of a method 400 arranged in accordance with examples described herein. The example method may include block 402, which may be followed by block 404, which may be followed by block 406, which may be followed by block 408, which may be followed by block 410. Additional, fewer, and/or different blocks may be used in other examples, and the order of the blocks may be different in other examples.

Block 402 recites "receive known encoded and decoded data pairs, the encoded data encoded with a particular encoding technique." The known encoded and decoded data pairs may be received by a computing device (e.g., electronic device 110) that includes a neural network, such as the neural network 150 of FIG. 1B, neural network 170 of FIG. 1C (e.g., as implemented by one or more processing units of FIGS. 2A-2C), and/or the ECC decoder 312 of FIG. 3. Signaling indicative of the set of data pairs may be provided to the computing device.

Block 404 may follow block 402. Block 404 recites "determine a set of weights for a neural network to decode data encoded with the particular encoding technique." For example, a neural network (e.g., any of the neural networks described herein) may be trained using the encoded and decoded data pairs received in block 402. The weights may be numerical values, which, when used by the neural network, allow the neural network to output decoded data corresponding encoded input data encoded with a particular encoding technique. The weights may be stored, for example, in the memory 145 of FIG. 2A, 2B, or 2C. In some examples, training may not be performed, and an initial set of weights may simply be provided to a neural network, e.g., based on training of another neural network.

In some examples, multiple sets of data pairs may be received (e.g., in block 402), with each set corresponding to data encoded with a different encoding technique. Accordingly, multiple sets of weights may be determined (e.g., in block 404), each set corresponding to a different encoding technique. For example, one set of weights may be determined which may be used to decode data encoded in accordance with LDPC coding while another set of weights may be determined which may be used to decode data encoded with BCH coding.

Block 406 may follow block 404. Block 406 recites "receive data encoded with the particular encoding technique." For example, data (e.g., signaling indicative of data) encoded with the particular encoding technique may be retrieved from a memory of a computing device and/or received using a wireless communications receiver. Any of a variety of encoding techniques may have been used to encode the data.

Block 408 may follow block 406. Block 408 recites "decode the data using the set of weights." By processing the encoded data received in block 406 using the weights, which may have been determined in block 404, the decoded data may be determined. For example, any neural network described herein may be used to decode the encoded data (e.g., the neural network 150 of FIG. 1B, neural network 170 of FIG. 1C (e.g., as implemented by one or more processing units of FIGS. 2A-2C), and/or the ECC decoder 312 of FIG. 3). In some examples, a set of weights may be selected that is associated with the particular encoding technique used to encode the data received in block 406. The set of weights may be selected from among multiple available sets of weights, each for use in decoding data encoded with a different encoding technique.

Block 410 may follow block 408. Block 410 recites "writing the decoded data to or reading the decoded data from memory." For example, data decoded in block 408 may be written to a memory, such as the memory device 314 of FIG. 3. In some examples, instead of or in addition to writing the data to memory, the decoded data may be transmitted to another device (e.g., using wireless communication techniques). While block 410 recites memory, in some examples any storage device may be used.

In some examples, blocks 406-410 may be repeated for data encoded with different encoding techniques. For example, data may be received in block 406, encoded with one particular encoding technique (e.g., LDPC coding). A set of weights may be selected that is for use with LDPC coding and provided to a neural network for decoding in block 408. The decoded data may be obtained in block 410. Data may then be received in block 406, encoded with a different encoding technique (e.g., BCH coding). Another set of weights may be selected that is for use with BCH coding and provided to a neural network for decoding in block 408. The decoded data may be obtained in block 410. In this manner, one neural network may be used to decode data that had been encoded with multiple encoding techniques.

Figure 5:
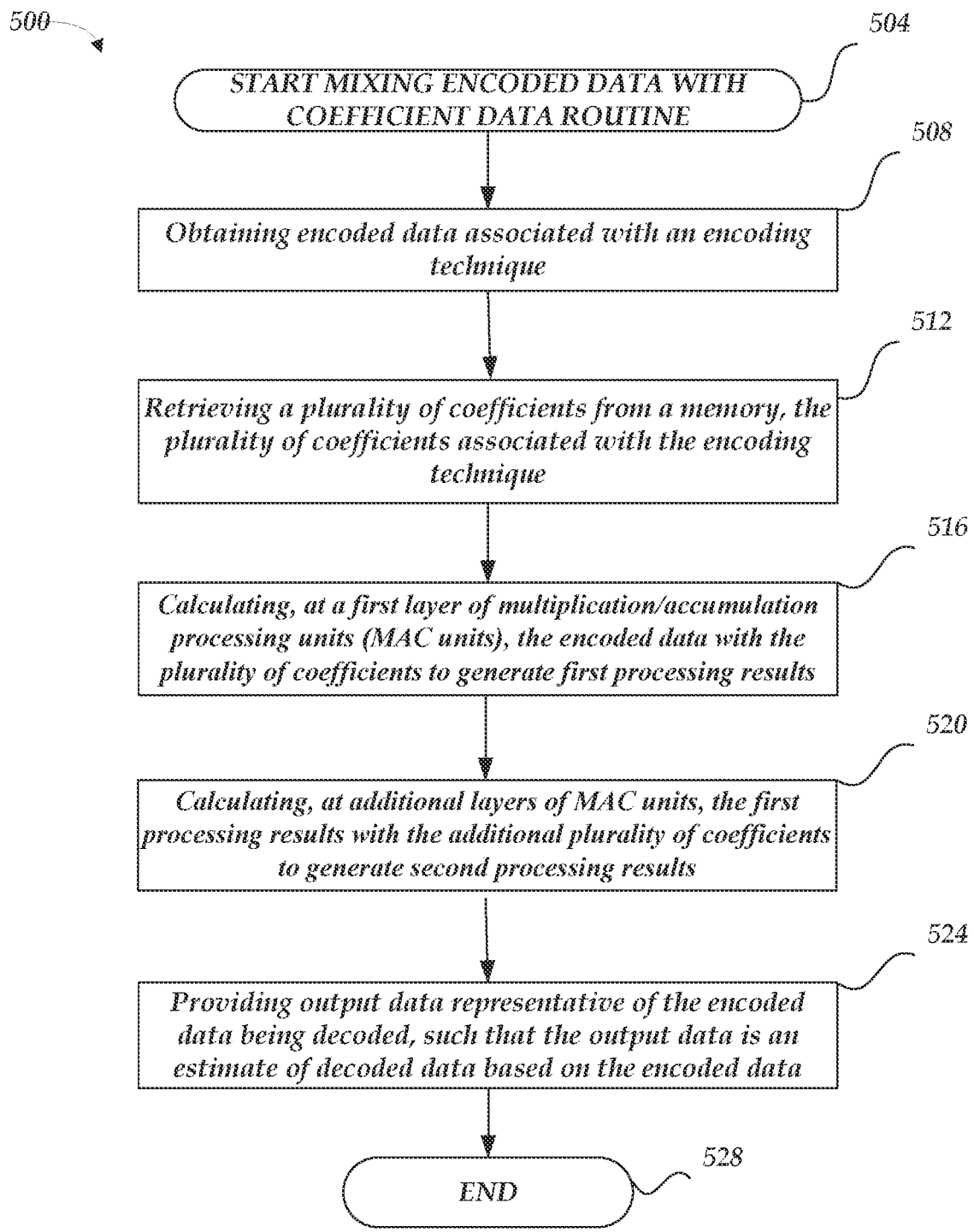

FIG. 5 is a flowchart of a method 500 in accordance with examples described herein. Example method 500 may be implemented using, for example, system 100 in FIG. 1A, the neural network 150 of FIG. 1B, neural network 170 of FIG.

1C (e.g., being implemented by one or more processing units of FIGS. 2A-2C), and/or the ECC decoder 312 of FIG. 3, or any system or combination of the systems depicted in the aforementioned Figures. In some examples, the blocks in example method 500 may be performed by a computing device such as an electronic device 110 of FIG. 1A and/or in conjunction with a processing unit, such as processing unit 112 of FIG. 2A, 2B, or 2C. The operations described in blocks 504-516 may also be stored as computer-executable instructions in a computer-readable medium such as the mode configurable control 105, storing the executable instructions 115.

Example method 500 may begin with a block 504 that starts execution of the mixing encoded input data with coefficient data routine. The method may include a block 508 that recites "obtaining encoded data associated with an encoding technique." As described herein, the processing unit may be configured to obtain a variety of types of input data that may be encoded with various encoding techniques, such as data that has been encoded with a low density parity check coding (LDPC), a Reed-Solomon coding, a Bose-Chaudhuri-Hocquenghem (BCH), and/or Polar coding. In the context of apparatus 300, the encoded data may be obtained from the memory device(s) 314, as described with respect to FIG. 3.

Block 508 may be followed by block 512 that recites "retrieving a plurality of coefficients from a memory, the plurality of coefficients associated with the encoding technique." As described herein, the processing unit may retrieve coefficients for mixing with encoded input data; for example, utilizing a memory look-up unit (MLU). For example, the memory may store (e.g., in a database) associations between coefficients and encoding techniques described herein. For example, the processing unit may request the coefficients from a memory part of the implementing computing device, from a memory part of an external computing device, or from a memory implemented in a cloud-computing device. In turn, the plurality of coefficients may be retrieved from the memory as requested by the processing unit.

Block 512 may be followed by block 516 that recites "calculating, at a first layer of multiplication/accumulation processing units (MAC units), the encoded data with the plurality of coefficients to generate first processing results." As described herein, the processing unit utilizes the plurality of coefficients such that mixing the coefficients with encoded input data generates output data that reflects the processing of the input data with coefficients by the circuitry of FIG. 2A, 2B, or 2C. In some implementations of a recurrent neural network (e.g., recurrent neural network 170), delayed versions of respective outputs of the first layer of MAC units and the encoded input data are mixed to generate the output data (e.g., an estimate of decoded data). For example, various ALUs in an integrated circuit may be configured to operate as the circuitry of FIG. 2A, 2B, or 2C, thereby mixing the input data and delayed versions of respective outputs of the first layer of MAC units with the coefficients as described herein. For example, with reference to FIG. 2A, the input data and delayed versions of respective outputs of the first layer of MAC units may be calculated with the plurality of coefficients to generate first processing results, at a first layer of multiplication/accumulation processing units (MAC units). In some examples, various hardware platforms may implement the circuitry of FIG. 2A, 2B, or 2C, such as an ASIC, a DSP implemented as part of a FPGA, or a system-on-chip.

Block 516 may be followed by block 520 that recites "calculating, at additional layers of MAC units, the first processing results with the additional plurality of coefficients to generate second processing results." As described herein, the processing unit utilizes additional plurality of coefficients such that mixing the coefficients with certain processing results generates output data that reflects the processing of the input data with coefficients by the circuitry of FIG. 2A, 2B, or 2C. In some implementations of a recurrent neural network (e.g., recurrent neural network 170), the first processing results and delayed versions of at least a portion of the first processing results are mixed to generate the output data (e.g., an estimate of decoded data). For example, with reference to FIG. 2A, the processing results of the first layer (e.g., multiplication processing results) and delayed versions of at least a portion of those processing results may be calculated with the additional plurality of coefficients to generate second processing results, at a second layer of multiplication/accumulation processing units (MAC units). The processing results of the second layer may be calculated with an additional plurality of coefficients to generate the output data B(1) 230.

Block 520 may be followed by block 524 that recites "providing output data representative of the encoded data being decoded, such that the output data is an estimate of decoded data based on the encoded data." As described herein, the neural network 150 or recurrent neural network 170 provides output data as output bits which represent the processed data, corresponding to the encoded input data (e.g., m encoded input bits) having been decoded according to the encoding technique. Accordingly, neural networks described herein transform encoded input data to decoded data (e.g., an estimate of the decoded data). Block 524 may be followed by block 528 that ends the example method 500. In some examples, block 512 may be an optional block.

The blocks included in the described example methods 400 and 500 are for illustration purposes. In some embodiments, the blocks may be performed in a different order. In some other embodiments, various blocks may be eliminated. In still other embodiments, various blocks may be divided into additional blocks, supplemented with other blocks, or combined together into fewer blocks. Other variations of these specific blocks are contemplated, including changes in the order of the blocks, changes in the content of the blocks being split or combined into other blocks, etc.

Examples described herein may refer to various components as "coupled" or signals as being "provided to" or "received from" certain components. It is to be understood that in some examples the components are directly coupled one to another, while in other examples the components are coupled with intervening components disposed between them. Similarly, signal may be provided directly to and/or received directly from the recited components without intervening components, but also may be provided to and/or received from the certain components through intervening components.

What is claimed is:

1. An apparatus, comprising:
a first stage of circuitry; and
at least a second stage of circuitry, wherein the first stage of circuitry and second stage of circuitry comprises a first plurality of multiplication/accumulation units, the first plurality of multiplication/accumulation units each configured to multiply at least one bit of encoded data with at least one of a set of predetermined weights and sum multiple weighted bits of the encoded data, wherein the set of predetermined weights are based on training of a network on encoded data and delayed versions of combinations of known encoded data.

2. The apparatus of claim 1, wherein the first stage of circuitry is configured to receive the encoded data, to combine the encoded data, and to evaluate at least one non-linear function using combinations of the encoded data and delayed versions of the combinations of the encoded data to provide intermediate data.

3. The apparatus of claim 1, wherein the second stage of circuitry is configured to receive the intermediate data and combine the intermediate data using the set of predetermined weights to provide decoded data the set of predetermined weights based at least in part on an encoding technique associated with the encoded data.

4. The apparatus of claim 1, wherein the first stage of circuitry further comprises a first plurality of memory lookup units (MLUs), the first plurality of MLUs each configured to retrieve at least one intermediate data value corresponding to an output of a respective one of the first plurality of multiplication/accumulation units based on at least one non-linear function.

5. The apparatus of claim 1, wherein the first stage of circuitry further comprises a plurality of delay units configured to provide delayed versions of the combinations of the encoded data based on at least one intermediate data value provided by a first plurality of MLUs.

6. The apparatus of claim 1, further comprising a memory in communication with the first stage of circuitry and a second stage of MAC circuitry, the memory configured to store multiple sets of predetermined weights, including the set of predetermined weights.

7. A method comprising:
decoding data using a neural network using a set of weights, wherein decoding the data using the neural network comprises weighting bits of the data using at least some of the set of weights, and summing selected weighted bits of the data to provide intermediate data, then weighting bits of the intermediate data using at least some of the weights and summing selected weighted bits of the intermediate data and selected delayed versions of the weighted bits of the intermediate data to provide the decoded data; and
writing the decoded data to or reading the decoded data from a memory or storage medium.

8. The method of claim 7, further comprising:
receiving, at a device that comprises the neural network, signaling indicative of one or more data pairs each comprising encoded data and decoded data, wherein the encoded data is encoded with an encoding technique.

9. The method of claim 8, further comprising:
determining the set of weights for the neural network to decode the data with the encoding technique based at least in part on the signaling, coefficient multiplication results associated with the signaling, delayed versions of the coefficient multiplication results associated with the signaling, or a combination thereof.

10. The method of claim 9, further comprising:
receiving signaling, from a memory of the device, indicative of the data encoded with the encoding technique.

11. The method of claim 10, further comprising:
determining one or more sets of weights for the network using additional encoded data, decoded data pairs encoded with other encoding techniques, and delayed versions of additional coefficient multiplication results based at least in part on the additional encoded data and the decoded data pairs encoded with the other encoding techniques, wherein the one or more sets of weights each corresponds with a different encoding technique;
selecting the set of weights associated with the encoding technique; and
providing the set of weights to the neural network or another neural network.

12. The method of claim 11, further comprising:
receiving further input data encoded with another encoding technique;
selecting a selected set of weights of the one or more sets of weights associated with the another encoding technique;
providing the selected set of weights to the neural network; and
decoding the further input data using the selected set of weights.

13. A method comprising:
mixing encoded data using a plurality of coefficients and an additional plurality of coefficients, wherein mixing the encoded data comprises:
calculating, at a first layer of processing units of a plurality of processing units, the encoded data and delayed versions of respective outputs of the first layer of processing units with the plurality of coefficients to generate first processing results;
calculating, at one or more additional layers of processing units of the plurality of processing units, the first processing results and delayed versions of at least a portion of the first processing results with the additional plurality of coefficients to generate second processing results; and
providing output data based partly on the second processing results.

14. The method of claim 13, wherein both the plurality of coefficients and the additional plurality of coefficients are associated with an encoding technique associated with the encoded data.

15. The method of claim 13, wherein the output data is representative of the encoded data being decoded, such that the output data is an estimate of decoded data based at least in part on the encoded data.

16. The method of claim 13, wherein mixing the encoded data received at the processing unit using the plurality of coefficients further comprises:
delaying, at respective delay units associated with the first layer of MAC units, the respective outputs of the first layer of MAC units to generate the delayed versions of the respective outputs of the first layer of MAC units.

17. The method of claim 13, wherein calculating, at the first layer of multiplication/accumulation processing units (MAC units) of the plurality of MAC units, the encoded data and the delayed versions of the respective outputs of the first layer of MAC units with the plurality of coefficients comprises:
multiplying the encoded data and the delayed versions of the respective outputs of the first layer of MAC units with respective coefficients of the plurality of coefficients to generate the first processing results.

18. The method of claim 13, further comprising:
obtaining, at the processing unit, signaling indicative of the encoded data from a memory, the signaling indicative of the encoded data including an indication from a communication device that the encoding technique was utilized.

19. The method of claim 13, wherein the encoding technique comprises Reed-Solomon coding, Bose-Chaudhuri-Hocquenghem (BCH) coding, low-density parity check (LDPC) coding, Polar coding, or a combination thereof.

* * * * *